United States Patent
Hiraiwa et al.

(10) Patent No.: US 8,502,254 B2
(45) Date of Patent: Aug. 6, 2013

(54) GROUP III NITRIDE SEMICONDUCTOR LIGHT-EMITTING DEVICE AND METHOD OF MANUFACTURING THE SAME, AND LAMP

(75) Inventors: Daisuke Hiraiwa, Ichihara (JP); Hironao Shinohara, Ichihara (JP)

(73) Assignee: Toyoda Gosei Co., Ltd., Aichi (JP)

(*) Notice: Subject to any disclaimer, the term of this patent is extended or adjusted under 35 U.S.C. 154(b) by 148 days.

(21) Appl. No.: 13/255,037

(22) PCT Filed: Mar. 5, 2010

(86) PCT No.: PCT/JP2010/001567
§ 371 (c)(1),
(2), (4) Date: Sep. 6, 2011

(87) PCT Pub. No.: WO2010/100949
PCT Pub. Date: Sep. 10, 2010

(65) Prior Publication Data
US 2012/0001220 A1 Jan. 5, 2012

(30) Foreign Application Priority Data

Mar. 6, 2009 (JP) .................... 2009-054204
Mar. 3, 2010 (JP) .................... 2010-046812

(51) Int. Cl.
*H01L 33/22* (2010.01)
(52) U.S. Cl.
USPC .......... 257/98; 257/99; 257/100; 257/81; 257/E33.064; 438/29; 438/28
(58) Field of Classification Search
USPC ......... 257/98, 99, 100, 81, E33.064; 438/29, 438/28
See application file for complete search history.

(56) References Cited

U.S. PATENT DOCUMENTS

| 2007/0080353 A1 | 4/2007 | Lee et al. |
| 2007/0272937 A1 | 11/2007 | Sakamoto et al. |
| 2009/0267109 A1 | 10/2009 | Fukunaga et al. |

FOREIGN PATENT DOCUMENTS

| JP | 08-250769 A | 9/1996 |
| JP | 09-129921 A | 5/1997 |
| JP | 2002-016288 A | 1/2002 |
| JP | 2006-128227 A | 5/2006 |
| JP | 3841460 B2 | 11/2006 |
| JP | 2007-073789 A | 3/2007 |
| JP | 2007-103951 A | 4/2007 |
| JP | 2008-010840 A | 1/2008 |
| JP | 2008-147459 A | 6/2008 |
| JP | 2008-192710 A | 8/2008 |

*Primary Examiner* — Junghwa M Im
(74) *Attorney, Agent, or Firm* — Sughrue Mion, PLLC

(57) ABSTRACT

Disclosed is a group III nitride semiconductor light-emitting device which suppresses electric current concentration in a light-transmitting electrode and a semiconductor layer directly below an electrode to enhance light emission efficiency, suppresses light absorption in the electrode or light loss due to multiple reflection therein to enhance light extraction efficiency, and has superior external quantum efficiency and electric characteristics. A semiconductor layer (20), in which an n-type semiconductor layer (4), a light-emitting layer (5) and a p-type semiconductor layer (6) are sequentially layered, is formed on a single-crystal underlayer (3) which is formed on a substrate (11). A light-transmitting electrode (7) is formed on the p-type semiconductor layer (6). An insulation layer (15) is formed on at least a part of the p-type semiconductor layer (6), and the light-transmitting electrode (7) is formed to cover the insulation layer (15). A positive electrode bonding pad (8) is provided in a position A corresponding to the insulation layer (15) provided on the p-type semiconductor layer (6), on a surface (7a) of the light-transmitting electrode (7). A sheet resistance of the n-type semiconductor layer (4) is lower than a sheet resistance of the light-transmitting electrode (7).

11 Claims, 5 Drawing Sheets

GROUP III NITRIDE SEMICONDUCTOR LIGHT-EMITTING DEVICE AND METHOD OF MANUFACTURING THE SAME, AND LAMP

CROSS REFERENCE TO RELATED APPLICATIONS

This application is a National Stage of International Application No. PCT/JP2010/001567, filed on Mar. 5, 2010, which claims priority from Japanese Patent Application Nos. 2009-054204, filed on Mar. 6, 2009 and JP 2010-046812 filed Mar. 3, 2010, the contents of all of which are incorporated herein by reference in their entirety.

BACKGROUND OF THE INVENTION

1. Technical Field

The present invention relates to a group III nitride semiconductor light-emitting device that has a light-emitting diode (LED) structure and a method of manufacturing the same, and a lamp.

Priority is claimed on Japanese Patent Application No. 2009-054204 filed on Mar. 6, 2009 and Japanese Patent Application No. 2010-46812 filed on Mar. 3, 2010, the content of which is incorporated herein by reference.

2. Background Art

In recent years, a group III nitride semiconductor has been attracting attention as a semiconductor material used for a light-emitting device which emits light of a short wavelength. The group III nitride semiconductor is represented by a general formula $Al_xGa_yIn_zN$ ($0 \leq x \leq 1$, $0 \leq y \leq 1$, $0 \leq z \leq 1$ and $x+y+z=1$), and is formed on a substrate made of sapphire single-crystal, various kinds of oxides or a group III-V compound, through a metal organic chemical vapor deposition (MOCVD) method, a molecular beam epitaxy (MBE) method, or the like.

In a general light-emitting device using a group III nitride semiconductor, an n-type semiconductor layer, a light-emitting layer, and a p-type semiconductor layer formed of the group III nitride semiconductor are sequentially layered on a sapphire single-crystal substrate. Since the sapphire substrate is an insulator, the device structure generally has a structure in which a positive electrode formed on the p-type semiconductor layer and a negative electrode formed on the n-type semiconductor layer are present on the same plane. Such a group III nitride semiconductor light-emitting device has two types: a face up type in which a light-transmitting electrode is used as a positive electrode to extract light from the p-type semiconductor side; and a flip chip type in which a highly reflective film of Ag or the like is used as a positive electrode to extract light from the sapphire substrate side.

External quantum efficiency is used as an output indicator of such a light-emitting device. When the external quantum efficiency is high, it is possible to say that the light-emitting device has a high output. The external quantum efficiency is represented as the product of internal quantum efficiency and light extraction efficiency.

Further, the internal quantum efficiency refers to the proportion of energy converted into light in the light-emitting layer from energy of electric current applied to the device. The light extraction efficiency refers to the proportion of light that can be extracted to the outside of the light-emitting device from light generated in the light-emitting layer.

Accordingly, in order to improve the external quantum efficiency, it is necessary to improve the light extraction efficiency in addition to light emission efficiency in the light-emitting layer.

There are mainly two ways to improve the light extraction efficiency. One is a method of reducing light absorbed by an electrode or the like formed on a light extraction surface. The other one is a method of reducing light confinement within the light-emitting device occurring due to a difference in refractive index between the light-emitting device and an outside medium thereof.

In this regard, as a characteristic of a gallium nitride-based compound semiconductor device having the above-mentioned composition, for example, there is less diffusion of electric current in a transverse direction. For this reason, electric current is applied to only a semiconductor portion directly below an electrode, and thus, light generated in the light-emitting layer is blocked by the electrode and is not extracted to the outside. Thus, in such a light-emitting device, a light-transmitting electrode is usually used, and light is extracted through the light-transmitting electrode.

In the related art, a known conductive material, such as a layered structure in which oxides of Ni, Co or the like and Au or the like which is contact metal are combined, has been used for the light-transmitting electrode. In recent years, a layered structure, in which a light transmission oxide having high conductivity such as ITO is used and the film thickness of contact metal is significantly thin to increase the transparency, has been used as the light-transmitting electrode, so that light from the light-emitting layer can be efficiently extracted to the outside.

Further, in the light-emitting device in the related art, in order to obtain a high level of light emission luminance, the entire light-emitting layer (semiconductor layer), which is not limited to only the portion directly below the electrode, should uniformly emit light. However, as mentioned above, in the light-emitting device in which the light-transmitting electrode is provided on the semiconductor layer and the bonding pad electrode is provided thereon, electric current is concentrated directly below the bonding pad electrode. Thus, as mentioned above, the light emission effect through the light-emitting layer is concentrated directly below the bonding pad electrode, to thereby lower light emission efficiency, which results in reduction in luminance.

In this regard, in order to prevent electric current from being concentrated directly below the bonding pad electrode in the light-emitting device which is provided with such a light-transmitting electrode, there has been proposed a light-emitting device in which an insulation layer is provided directly below a bonding pad electrode (for example, refer to Patent Documents 1 and 2). In the light-emitting devices as disclosed in Patent Documents 1 and 2, as the insulation layer is provided as mentioned above, electric current diffusion in a transverse direction in a light-transmitting electrode is effectively facilitated, thereby making it possible to enhance light emission efficiency. However, in the light-emitting devices disclosed in Patent Documents 1 and 2, light emission is relatively strong in the proximity of an n-side bonding pad electrode, and there may be a problem in that it is difficult to obtain a superior electric characteristic, and the light emission efficiency cannot necessarily be enhanced.

[Patent Document 1] Japanese Patent No. 3841460
[Patent Document 2] JP-A-2008-192710

SUMMARY OF THE INVENTION

Accordingly, an object of the present invention is to provide a group III nitride semiconductor light-emitting device which suppresses electric current concentration in a light-transmitting electrode and a semiconductor layer directly below an n-side bonding pad electrode to enhance light emission efficiency, suppresses light absorption in the electrode or light loss due to multiple reflection therein to enhance light extraction efficiency, and has superior external quantum efficiency and electric characteristics.

It is another object of the present invention to provide a method of manufacturing a group III nitride semiconductor light-emitting device which is capable of manufacturing such a light-emitting device having superior external quantum efficiency and light emission efficiency.

It is still another object of the present invention to provide a lamp using the above-described group III nitride semiconductor light-emitting device which has superior light emission characteristics.

To solve the above problems, the present inventors found that when a sheet resistance of an n-type semiconductor layer, which is an n-side, is smaller than a sheet resistance of a light-transmitting electrode, which is a p-side, light emission in the proximity of an n-side bonding pad electrode is reduced to thereby enhance light extraction efficiency, while it is preferable that the sheet resistances of the n-side and p-side layers be at the same level and electric current be uniformly diffused in view of light emission efficiency, in the related light-emitting device. In this regard, it is clear that light absorption or multiple reflection in a p-side bonding pad electrode can be prevented by an insulation layer provided directly below the p-side bonding pad electrode.

Further, the present inventors found that the sheet resistance of the n-side layer predominantly works for a driving voltage of the light-emitting device, and that electric characteristics are significantly enhanced in a case where the sheet resistance of the n-side layer is set relatively low, and particularly, in a case where a drive electric current of about 30 mA to about 100 mA is applied to the light-emitting device, to then complete the present invention.

That is, the present invention relates to the following configurations.

[1] A group III nitride semiconductor light-emitting device including: a substrate; a single-crystal group III nitride semiconductor layer which is formed on the substrate; a semiconductor layer which is formed on the single-crystal group III nitride semiconductor layer and in which an n-type semiconductor layer, a light-emitting layer and a p-type semiconductor layer are sequentially layered; and a light-transmitting electrode which is formed on the p-type semiconductor layer, wherein an insulation layer is formed on at least a part of the p-type semiconductor layer, and the light-transmitting electrode is formed to cover the insulation layer, wherein a positive electrode bonding pad is provided above the insulation layer provided on the p-type semiconductor layer, on a surface of the light-transmitting electrode, and wherein a sheet resistance of the n-type semiconductor layer is lower than a sheet resistance of the light-transmitting electrode.

[2] The device according to [1], wherein the sheet resistance of the n-type semiconductor layer is 15 Ω/sq or less, and the sheet resistance of the light-transmitting electrode is 30 Ω/sq or less.

[3] The device according to [1] or [2], wherein at least a part of the surface of the light-transmitting electrode is a rough surface.

[4] The device according to any one of [1] to [3], wherein the light-transmitting electrode employs at least one selected from the group including ITO (Indium Tin Oxide), IZO (Indium Zinc Oxide), IGO (Indium Gallium Oxide), ICO (Indium Cerium Oxide) and conductive titanium oxide ($TiO_2$).

[5] The device according to any one of [1] to [4], wherein the insulation layer is formed of silicon dioxide ($SiO_2$).

[6] A method of manufacturing a group III nitride semiconductor light-emitting device, the method including: an epitaxial step of forming a single-crystal group III nitride semiconductor layer on a substrate; a semiconductor layer forming step of forming a semiconductor layer by sequentially layering an n-type semiconductor layer, a light-emitting layer and a p-type semiconductor layer on the single-crystal group III nitride semiconductor layer; and a light-transmitting electrode forming step of forming a light-transmitting electrode on the p-type semiconductor layer, wherein an insulation layer is formed on at least a part of the p-type semiconductor layer, and the light-transmitting electrode is then formed to cover the insulation layer on the p-type semiconductor layer, in the light-transmitting electrode forming step, wherein the method further includes a positive electrode forming step of forming a positive electrode bonding pad above the insulation layer formed on the p-type semiconductor layer, on a surface of the light-transmitting electrode, after the light-transmitting electrode forming step, and wherein the n-type semiconductor layer is formed so that a sheet resistance of the n-type semiconductor layer is lower than a sheet resistance of the light-transmitting electrode, in the semiconductor layer forming step.

[7] The method according to [6], wherein the n-type semiconductor layer is formed to have a sheet resistance of 15 Ω/sq or less in the semiconductor layer forming step, and the light-transmitting electrode is formed to have a sheet resistance of 30 Ω/sq or less in the light-transmitting electrode forming step.

[8] The method according to [6] or [7], wherein at least a part of the surface of the light-transmitting electrode is a rough surface, in the light-transmitting electrode forming step.

[9] The method according to any one of [6] to [8], wherein at least one selected from the group including ITO (Indium Tin Oxide), IZO (Indium Zinc Oxide), IGO (Indium Gallium Oxide), ICO (Indium Cerium Oxide) and conductive titanium oxide ($TiO_2$) is used as a material which forms the light-transmitting electrode, in the light-transmitting electrode forming step.

[10] The method according to any one of [6] to [9], wherein silicon dioxide ($SiO_2$) is used as a material which forms the insulation layer, in the light-transmitting electrode forming step.

[11] A lamp including the group III nitride semiconductor light-emitting device according to any one of [1] to [5].

According to the group III nitride semiconductor light-emitting device of the present invention, the semiconductor layer in which the n-type semiconductor layer, the light-emitting layer and the p-type semiconductor layer are sequentially layered is formed on the single-crystal group III nitride semiconductor layer which is formed on the substrate; the light-transmitting electrode is formed on the p-type semiconductor layer; the insulation layer is formed on at least a part of the p-type semiconductor layer, and the light-transmitting electrode is formed to cover the insulation layer; and the positive electrode bonding pad is provided above the insulation layer provided on the p-type semiconductor layer, on the surface of the light-transmitting electrode. Thus, electric current concentration can be suppressed in a position of the light-transmitting electrode and the semiconductor layer corresponding to the positive electrode bonding pad, to thereby enhance light emission efficiency. Further, since the sheet resistance of the n-type semiconductor layer is lower than the sheet resistance of the light-transmitting electrode, light emission in the proximity of a negative electrode bonding pad which is provided on the n-type semiconductor layer is suppressed. Further, in a case where the light-emitting layer is not removed around the positive electrode bonding pad, the area of a portion in which light emission intensity is high is enlarged, to thereby enhance light extraction efficiency. Further, since the film thickness of the light-transmitting electrode can be formed to be thin, it is possible to enhance light transmittance, and to further enhance light extraction efficiency. Thus, it is possible to provide a group III nitride semiconductor light-emitting device which has superior light emission efficiency and light extraction efficiency, high exterior quantum efficiency, and superior electric characteristics.

Further, according to the method of manufacturing the group III nitride semiconductor light-emitting device of the present invention, the method includes: the epitaxial step of forming the single-crystal group III nitride semiconductor layer on the substrate; the semiconductor layer forming step of forming the semiconductor layer by sequentially layering the n-type semiconductor layer, the light-emitting layer and the p-type semiconductor layer on the single-crystal group III nitride semiconductor layer; and the light-transmitting electrode forming step of forming the light-transmitting electrode on the p-type semiconductor layer. Here, in the light-transmitting electrode forming step, the insulation layer is formed on at least a part of the p-type semiconductor layer, and the light-transmitting electrode is then formed to cover the insulation layer on the p-type semiconductor layer. After the light-transmitting electrode forming step, the method further includes a positive electrode forming step of forming the positive electrode bonding pad above the insulation layer formed on the p-type semiconductor layer, on the surface of the light-transmitting electrode. In the semiconductor layer forming step, the n-type semiconductor layer is formed so that the sheet resistance of the n-type semiconductor layer is lower than the sheet resistance of the light-transmitting electrode. Accordingly, it is possible to manufacture a group III nitride semiconductor light-emitting device which has superior light emission efficiency and light extraction efficiency, superior exterior quantum efficiency, and superior electric characteristics, as described above.

Further, the lamp according to the present invention uses the group III nitride semiconductor light-emitting device according to the present invention, and thus has superior light emission characteristics.

DETAILED DESCRIPTION OF THE INVENTION

Hereinafter, embodiments of a group III nitride semiconductor light-emitting device (hereafter, may be referred to as a "light-emitting device"), a method of manufacturing thereof, and a lamp according to the present invention will be described with reference to FIGS. 1 to 6.

[Group III Nitride Semiconductor Light Emitting Device (Light Emitting Device)]

Figure 1:
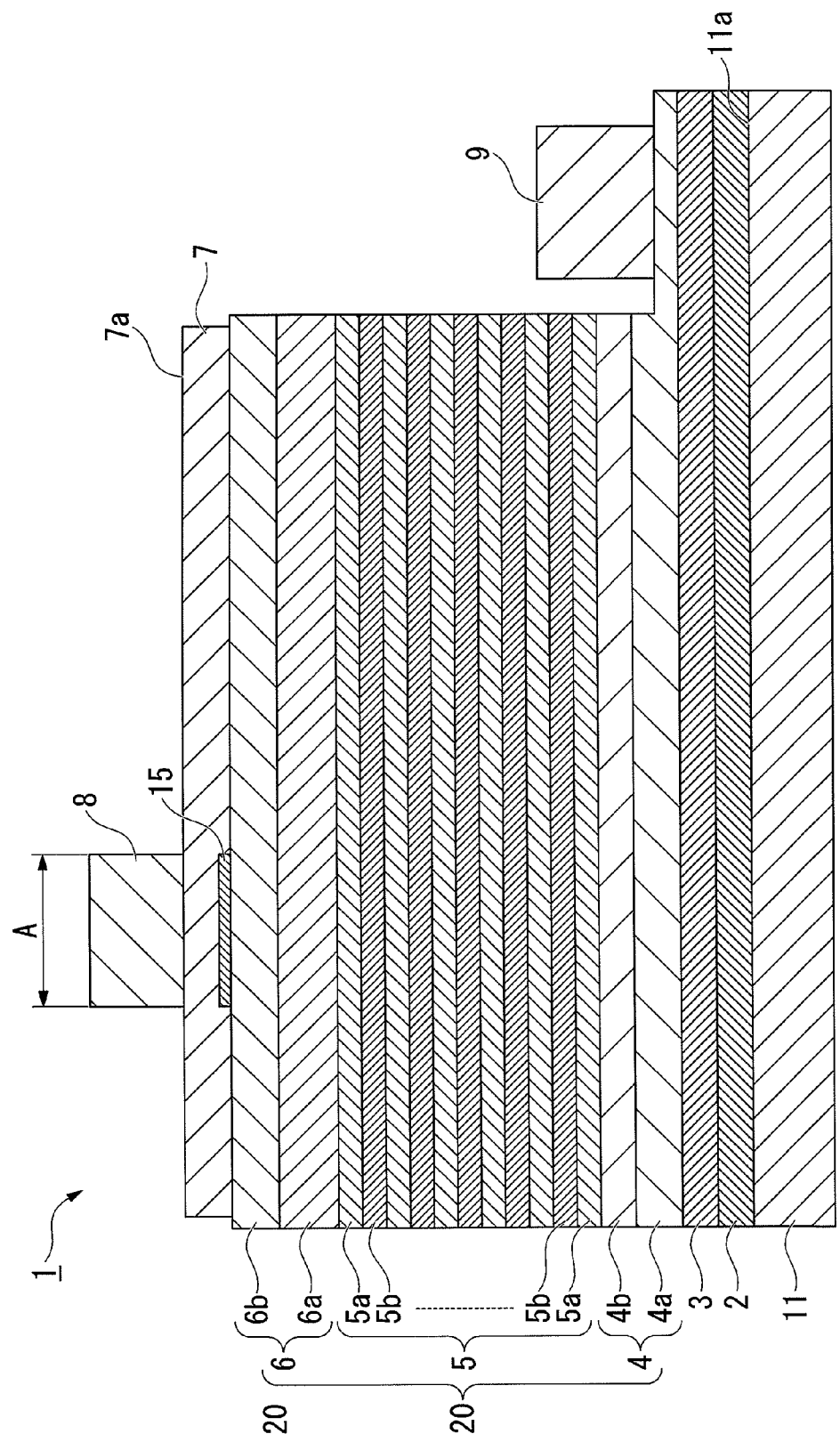
FIG. 1 is a diagram schematically illustrating an example of a group III nitride semiconductor light-emitting device according to the present invention, which is a cross-sectional diagram showing a layered structure in which a buffer layer and a underlayer formed of a group III nitride semiconductor are formed on a main surface of a substrate, a semiconductor layer is formed thereon and an insulation layer and a light-transmitting electrode are formed on the semiconductor layer.
Figure 2:
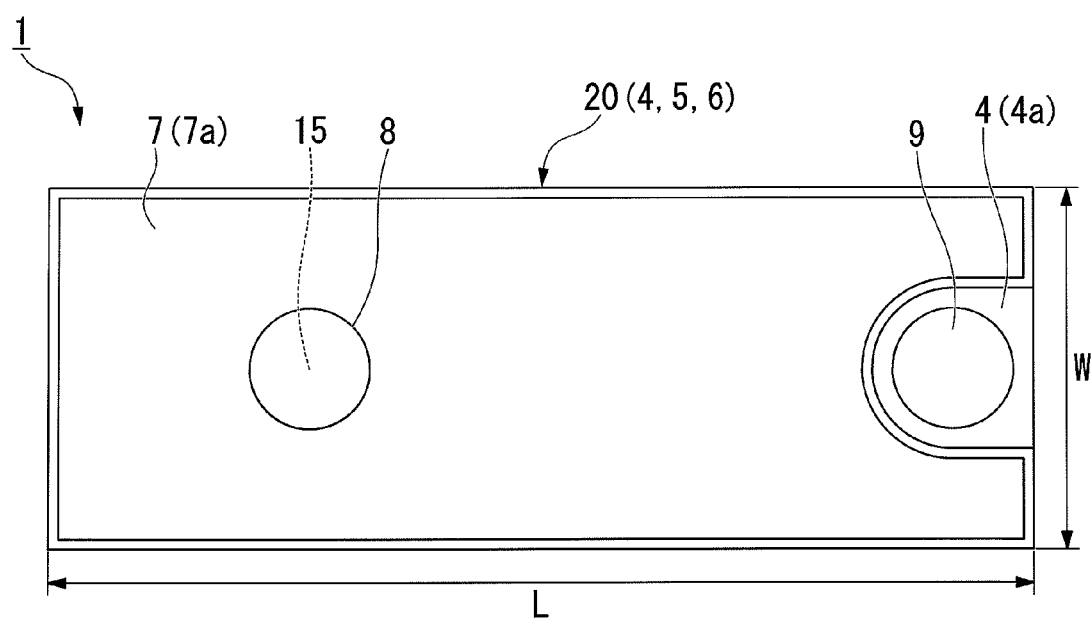
FIG. 2 is a diagram schematically illustrating an example of a group III nitride semiconductor light-emitting device according to the present invention, which is a plan view of the group III nitride semiconductor light-emitting device shown in FIG. 1.

As an example shown in FIGS. 1 and 2, a light-emitting device 1 according to the present embodiment includes a semiconductor layer 20 which is provided with an n-type semiconductor layer 4, a light-emitting layer 5 and a p-type semiconductor layer 6 which are sequentially layered, which is formed on a single-crystal underlayer (group III nitride semiconductor layer) 3 formed on a main surface 11a of a substrate 11; a light-transmitting electrode 7 formed on the p-type semiconductor layer 6; and an insulation layer 15 formed on at least a part of the p-type semiconductor layer 6. Here, the light-transmitting electrode 7 is formed to cover the insulation layer 15. Further, the light-emitting device 1 of the example shown in FIGS. 1 and 2 has a configuration in which a sheet resistance Rs2 of the n-type semiconductor layer 4 is lower than a sheet resistance Rs1 of the light-transmitting electrode 7. Further, in this example, a buffer layer 2 is formed between the substrate 11 and the underlayer 3, a positive electrode bonding pad 8 is provided on the light-transmitting electrode 7, and a negative electrode bonding pad 9 is provided on the n-type semiconductor layer 4 which is exposed by removing a part of the semiconductor layer 20. Further, the light-emitting device 1 of this example has an approximately rectangular planar shape in which a chip length (L) in FIG. 2 in a direction where the positive electrode bonding pad 8 and the negative electrode bonding pad 9 are separated is larger than a chip width (W). Further, in the present embodiment, the planar shape of the chip shown in FIG. 2 may be a square shape or a rectangular shape in which the chip length (L) to the chip width (W) may be in the range of 1:1 (L/W=1) to 2.7:1 (L/W=2.7).

With such a configuration, the light-emitting device 1 according to the present embodiment is formed as a light-emitting diode (LED) as shown.

Hereinafter, the layered structure of the light-emitting device 1 will be described in detail.

[Substrate]

(Material of Substrate)

In the light-emitting device of the present embodiment, there is no particular limitation to a material used for the substrate 11 as described above, as long as a group III nitride semiconductor crystal is able to epitaxially grow on the surface of the substrate material, and a variety of materials may be selected for use. For example, the substrate material may include sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, or the like. Further, among the above-mentioned substrate materials, sapphire is particularly preferred, and a buffer layer 2 (to be described in detail later) is preferably formed on a main surface 11a formed as a c plane of the sapphire substrate 11.

Among the above-mentioned substrate materials, in a case where an oxide substrate or a metal substrate is used which is known to undergo chemical denaturation upon contact with ammonia at high temperature, the buffer layer 2 is formed without using ammonia, and the underlayer 3 is formed using ammonia, the buffer layer 2 also acts as a coating layer, to thereby effectively prevent the chemical denaturation of the substrate 11.

Further, in a case where the buffer layer 2 is formed by a sputtering method, the temperature of the substrate 11 can be suppressed to a low level, meaning that even in a case where the substrate 11 is formed of a material that undergoes decomposition at high temperature, each of the layers can be formed on the substrate 11 without damaging the substrate 11.

[Buffer Layer]

In the present embodiment, it is preferable to form the buffer layer 2 on the main surface 11a of the substrate 11 and to form the underlayer 3 thereon. For example, the buffer layer 2 is layered on the substrate 11 so as to have a composition of $Al_xGa_{1-x}N$ ($0 \leq x \leq 1$), and can be formed, for example, through a reactive sputtering method in which a gas containing a group V element and a metallic material are activated with plasma to react. The film formed using the metallic material that is made into plasma, according to the present embodiment, has an effect in that orientation can be easily obtained.

The buffer layer 2 has a function to decrease any difference in lattice constant between the substrate 11 and the underlayer 3 to thereby facilitate the formation of a single-crystal layer oriented along the C-axis on the C plane of the substrate 11. Accordingly, by layering the single-crystal group III nitride semiconductor layer (the underlayer 3) on the buffer layer 2, the underlayer 3 can be formed with a superior crystalline characteristic. In the present embodiment, a configuration in which the buffer layer 2 is omitted may be employed.

In this embodiment, it is preferable that the buffer layer 2 have a composition of $Al_xGa_{1-x}N$ ($0 \leq x \leq 1$), and it is more preferable that the buffer layer 2 made of AlN. Generally, as the buffer layer to be layered on the substrate, a composition including Al is preferably used, and any material may be used as long as it is a group III nitride compound represented by the general formula $Al_xGa_{1-x}N$ ($0 \leq x \leq 1$). Alternatively, a composition including As or P, which are group V elements, may be used. Here, in the case of the composition including Al, it is preferable that the buffer layer 2 be GaAlN. In this case, it is more preferable that the component of Al be 50% or more. Further, it is most preferable that the buffer layer 2 be formed of AlN. Further, as the material which forms the buffer layer 2, a material having the same crystal structure as that of the group III nitride semiconductor may be used. However, it is preferable that the length of its lattice be close to the group III nitride semiconductor which forms the underlayer (which will be described later), and a nitride of a group IIIa element in the periodic table is particularly preferable.

The crystals of the group III nitride which form the buffer layer 2 have a crystal structure of a hexagonal system, and may be formed as a single-crystal film by controlling film forming conditions. Further, by controlling the above-mentioned film forming conditions, the crystals of the group III nitride may also be formed as columnar crystals (polycrystals) composed of a texture based on hexagonal columns. Here, the "columnar crystals" described herein refer to crystals in which a crystal grain boundary is formed between adjacent crystal grains to be separated from each other and the crystal itself adopts a columnar shape in a longitudinal cross-section.

It is preferable that the buffer layer 2 have a single-crystal structure, from the viewpoint of a buffering function. As described above, the crystals of the group III nitride have the hexagonal crystal system and form the texture based on the hexagonal columns. By controlling the film forming conditions and the like, the crystals of the group III nitride can be grown not only in the upward direction, but also across the in-plane direction. When the buffer layer 2 having such a single-crystal structure is formed on the substrate 11, the buffering function of the buffer layer 2 is effectively carried out, and as a result, the group III nitride semiconductor layer formed on the buffer layer 2 becomes a crystalline film having a superior orientation and crystalline characteristic.

The film thickness of the buffer layer 2 is preferably within a range of 0.01 to 0.5 μm. By making the film thickness of the buffer layer 2 within the above range, the buffer layer 2 can be obtained which has a superior orientation and which effectively functions as a coating layer when forming each of the layers composed of a group III nitride semiconductor on the buffer layer 2. If the film thickness of the buffer layer 2 is less than 0.01 μm, the buffer layer 2 may not sufficiently function as the above-mentioned coating layer, and the buffering function for decreasing the difference in lattice constant between the substrate 11 and the underlayer 3 may become insufficient. Further, if the buffer layer 2 is formed with a film thickness exceeding 0.5 μm, its film forming process may require a longer time, thereby lowering its productivity, even though its buffering function or the function as a coating layer is not enhanced. Further, the film thickness of the buffer layer 2 is more preferably within a range of 0.02 to 0.1 μm.

[Group III Nitride Semiconductor Layer (Underlayer)]

As described above, the underlayer (group III nitride semiconductor layer) 3 included in the light-emitting device 1 of the present embodiment includes the group III nitride semiconductor, and can be formed by being layered on the buffer layer 2 through a known MOCVD method.

As the material of the underlayer 3, for example, $Al_xGa_yIn_zN$ ($0 \leq x \leq 1$, $0 \leq y \leq 1$, $0 \leq z \leq 1$, and $x+y+z=1$) may be used. However, it is more preferable to employ an $Al_yGa_{1-y}N$ layer ($0 \leq y \leq 1$, preferably $0 \leq y \leq 0.5$, and more preferably $0 \leq y \leq 0.1$) in view of forming the underlayer 3 with a superior crystalline characteristic. Further, although a different material from that of the buffer layer 2 may be used as the material of the underlayer 3 as described above, the same material as that of the buffer layer 2 may also be used.

Further, as necessary, the underlayer 3 may be doped with an n-type impurity so that the concentration of the impurity is within a range of $1 \times 10^{17}$ to $1 \times 10^{19}/cm^3$, but may have an undoped structure ($<1 \times 10^{17}/cm^3$). Here, the undoped structure is preferred in view of maintaining a superior crystalline characteristic.

In a case where the substrate 11 is electrically conductive, by doping the underlayer 3 with a dopant to make the layer electrically conductive, electrodes can be formed on the top and bottom of the light-emitting device. On the other hand, in a case where an insulating material is used as the substrate 11, since a chip structure is adopted in which both a positive electrode and a negative electrode are provided on the same surface of the light-emitting device, it is preferable to form the underlayer 3 as an undoped crystal to obtain a superior crystalline characteristic. There is no particular limitation to the n-type impurity to be doped in the underlayer 3. For example, Si, Ge, Sn and the like may be used, and Si and Ge may be preferably used.

It is preferable that the thickness of the underlayer 3 be within a range of 1 to 8 μm in view of a underlayer with a superior crystalline characteristic, and it is more preferable that the thickness of the underlayer 3 be within a range of 2 to 5 μm in view of reduction in a process time necessary for the film formation to enhance productivity.

[Semiconductor Layer]

The semiconductor layer 20 formed on the underlayer 3 includes the n-type semiconductor layer 4, the light-emitting layer 5 and the p-type semiconductor layer, each of which is made of the group III nitride semiconductor. Each layer of the semiconductor layer 20 is formed by the MOCVD method, to thereby obtain a higher crystalline characteristic.

[N-Type Semiconductor Layer]

The n-type semiconductor layer 4 generally includes an n-type contact layer 4a and an n-type cladding layer 4b. Further, the n-type contact layer 4a may also serve as the n-type cladding layer 4b.

The n-type contact layer 4a is a layer used for providing a negative electrode. The n-type contact layer 4a preferably includes an $Al_xGa_{1-x}N$ layer ($0 \leq x < 1$, more preferably $0 \leq x \leq 0.05$, and even more preferably $0 \leq x \leq 0.1$). Further, the n-type contact layer 4a is preferably doped with an n-type impurity. The concentration of the n-type impurity is within a range of $1.5 \times 10^{17}$ to $1.5 \times 10^{20}/cm^3$, and preferably within a range of $1.5 \times 10^{18}$ to $1.5 \times 10^{19}/cm^3$, in view of maintenance of excellent ohmic contact with the negative electrode and effective reduction of a sheet resistance Rs2 of the n-type semiconductor layer 4. There is no particular limitation to the n-type impurity. For example, Si, Ge, Sn and the like may be used, and Si and Ge may be preferably used.

The film thickness of the n-type contact layer 4a is preferably within a range of 0.5 to 5 μm, and more preferably within a range of 1 to 3 μm. If the film thickness of the n-type contact layer 4a is within the above-mentioned range, a superior crystalline characteristic of the semiconductor is maintained.

It is preferable that the n-type cladding layer 4b be provided between the n-type contact layer 4a and the light-emitting layer 5. The n-type cladding layer 4b is a layer which is used for performing carrier injection into and carrier confinement within the light-emitting layer 5. The n-type cladding layer 4b may be formed of AlGaN, GaN, GaInN, or the like. Further, the n-type cladding layer 4b may also adopt a super-lattice structure having hetero junction or multiple layers of these structures. When forming the n-cladding layer 4b with GaInN, it is preferable that its bandgap be larger than that of GaInN in the light-emitting layer 5.

The film thickness of the n-type cladding layer 4b is not particularly limited, and is preferably within the range of 0.005 to 0.5 μm and more preferably within the range of 0.005 to 0.1 μm. The n-type dopant concentration in the n-type cladding layer 4b is preferably within the range of $1.5 \times 10^{17}$ to $1.5 \times 10^{20}/cm^3$ and more preferably within the range of $1.5 \times 10^{18}$ to $1.5 \times 10^{19}/cm^3$. It is preferable that the dopant concentration be within this range for maintaining a satisfactory crystalline characteristic, for reducing the operating voltage of the device, and for effectively reducing the sheet resistance Rs2 of the n-type semiconductor layer 4.

In the light-emitting device 1 according to the present embodiment, the sheet resistance Rs2 of the n-type semiconductor layer 4 is lower than the sheet resistance Rs1 of the light-transmitting electrode 7 (which will be described in detail later). Further, in this embodiment, it is preferable that the sheet resistance Rs2 of the n-type semiconductor layer 4 be 15 Ω/sq or less and it is more preferable that the sheet resistance Rs1 of the light-transmitting electrode 7 be 30 Ω/sq or less. In this way, as means for controlling the resistance value of the n-type semiconductor layer 4 or the light-transmitting electrode 7, for example, a method of appropriately adjusting the film thickness is used. In a case where the sheet resistance Rs2 of the n-type semiconductor layer 4 is the above-described value, it is preferable to make the entire film thickness of the n-type semiconductor layer 4 be 2 μm or more.

Further, in order to control the sheet resistance Rs2 of the n-type semiconductor layer 4, a method of controlling the doping amount of the n-type impurity such as Si may be performed. In this embodiment, since the sheet resistance Rs2 of the n-type semiconductor layer 4 is lower than the sheet resistance Rs1 of the light-transmitting electrode 7, the doping amount of the n-type impurity such as Si is preferably 1.5 times, for example, more than a general doping amount of the n-type impurity included in the light-emitting device in the related art. Thus, it is possible to control the sheet resistance Rs2 to be in the above-described desired range, and specifically, it is preferable that the doping amount be within the range.

In the light-emitting device in the related art, it was preferable that the sheet resistances of the n-type semiconductor layer 4 and the p-side light-transmitting electrode 7 be set at the same level, and the electric current was uniformly diffused in the light-transmitting electrode 7 and the semiconductor layer 20, in view of light emission efficiency. However, there is a problem in that light emission efficiency and light extraction efficiency are reduced with such a configuration.

In order to solve such a problem, the present inventors found that the insulation layer 15 (which will be described in detail later) is formed on the p-type semiconductor layer 6 and the sheet resistance (Rs2) of the n-type semiconductor layer 4 is controlled to be lower than the sheet resistance (Rs1) of the light-transmitting electrode 7, so that light emission around the negative electrode bonding pad 9 formed on the n-type semiconductor layer 4 is suppressed, and the area of a portion where light emission intensity is high is enlarged around the positive electrode bonding pad 8 in which the light-emitting layer 5 is not removed to thereby enhance light extraction efficiency. Further, the present inventors also found that the sheet resistance Rs2 of the n-type semiconductor layer 4 predominantly works for a driving voltage (Vf) of the light-emitting device 1, and that an electric characteristic is significantly enhanced by controlling the sheet resistance (Rs2) to be lower than the sheet resistance (Rs1) of the light-transmitting electrode 7. Thus, it is possible to achieve the light-emitting device 1 which has superior light extraction efficiency and external quantum efficiency, and has high light emission output and electric characteristics.

In a case where the n-type cladding layer 4b is made into a layer containing a super-lattice structure, although not shown in detail, the n-type cladding layer 4b may include a layered structure including an n-side first layer formed of a group III nitride semiconductor having a film thickness of 100 angstroms or less, and an n-side second layer having a different composition from that of the n-side first layer and formed of a group III nitride semiconductor having a film thickness of 100 angstroms or less. Further, the n-type cladding layer 4b may also include a structure in which the n-side first layer and the n-side second layer are layered repeatedly in an alternating arrangement. Further, the n-type cladding layer 4b may also adopt such a configuration that either the n-side first layer or the n-side second layer is brought into contact with the light-emitting layer 5.

The above-mentioned n-side first layer and n-side second layer may be formed, for example, using a composition of an AlGaN system containing Al (hereinafter, may be simply referred to as "AlGaN"), a GaInN system containing In (hereinafter, may be simply referred to as "GaInN"), or GaN. Further, the n-side first layer and the n-side second layer may also be a GaInN/GaN alternating structure, an AlGaN/GaN alternating structure, a GaInN/AlGaN alternating structure, a GaInN/GaInN alternating structure having a different composition (in the present embodiment, the expression "different composition" refers to a different compositional ratio of the respective components, this definition also applies below), or an AlGaN/AlGaN alternating structure having a different composition. In the present embodiment, the n-side first layer and the n-side second layer preferably have either a GaInN/GaN alternating structure or GaInN/GaInN having a different composition.

The super-lattice layers of the n-side first layer and the n-side second layer are preferably 60 angstroms or less, are more preferably 40 angstroms or less, and are most preferably within a range of 10 to 40 angstroms, in each case. If the film thickness of the n-side first layer and n-side second layer that form the super-lattice layers exceeds 100 angstroms, crystal defects become more prevalent, which is undesirable.

The n-side first layer and the n-side second layer may be a doped structure, or may be a combination of a doped structure and an undoped structure, respectively. As the doping impurity, any known impurity used for doping the above material compositions may be used without any limitation. For example, in a case where a GaInN/GaN alternating structure or a GaInN/GaInN alternating structure having a different composition is used as the n-type cladding layer, Si is appropriate as the impurity. In addition, the above-mentioned n-side super-lattice multilayer film may be formed with the doping appropriately switched ON and OFF, even if the representative composition such as GaInN, AlGaN or GaN is the same.

As described above, by adopting a layer structure in which the n-type cladding layer 4b includes a super-lattice structure, the light-emitting device 1 having significantly improved light emission output and superior electrical characteristics can be obtained.

[Light-Emitting Layer]

As the light-emitting layer layered on the n-type semiconductor layer, the light-emitting layer 5 has a single quantum well structure, a multiple quantum well structure, or the like. As a well layer having a quantum well structure as shown in FIG. 1, a group III nitride semiconductor having a composition of $Ga_{1-y}In_yN$ ($0<y<0.4$) is generally used in a case where a well layer for achieving blue light emission is configured. However, in the case of a well layer 5b for achieving green light emission, an increased indium composition such as $Ga_{1-y}In_yN$ ($0.07<y<0.20$) is used.

In the case of the light-emitting layer 5 having a multiple quantum well structure as in the present embodiment, it is preferable that the well layer 5b be formed of $Ga_{1-y}In_yN$ as described above and a barrier layer 5a be formed of a layer $Al_zGa_{1-z}N$ ($0≦z<0.3$) exhibiting a larger band gap energy than that of the well layer 5b. Further, the well layer 5b and the barrier layer 5a may be or may not be doped with an impurity.

Further, the film thickness of the well layer 5b may be set to such a degree that the quantum effect can be achieved, for example, 1 to 10 nm, and preferably, may be 2 to 6 nm, in view of light emission output.

[p-Type Semiconductor Layer]

The p-type semiconductor layer 6 generally includes a p-type cladding layer 6a and a p-type contact layer 6b. Further, the p-type contact layer 6b may also function as the p-type cladding layer 6a.

The p-type cladding layer 6a is a layer which performs carrier confinement within and carrier injection into the light-emitting layer 5. There is no particular limitation to composition of the p-type cladding layer 6a, as long as the composition exhibits a larger band gap energy than that of the light-emitting layer 5 and the layer is capable of confining a carrier in the light-emitting layer 5, but the composition may preferably include $Al_xGa_{1-x}N$ ($0<x≦0.4$), for example. The p-type cladding layer 6a including such as AlGaN is preferred in view of carrier confinement within the light-emitting layer 5. There is no particular limitation to the film thickness of the p-type cladding layer 6a. However, the film thickness is preferably within a range of 1 to 400 nm, and more preferably within a range of 5 to 100 nm. The p-type dopant concentration of the p-type cladding layer 6a is preferably within a range of $1×10^{18}$ to $1×10^{21}$/cm³, and more preferably from $1×10^{19}$ to $1×10^{20}$/cm³. If the p-type dopant concentration is within the above-mentioned range, excellent p-type crystals can be obtained without deteriorating the crystalline characteristic.

Further, the p-type cladding layer 6a may be formed as a super-lattice structure in which a plurality of layers is formed.

In a case where the p-type cladding layer 6a is made into a layer having a super-lattice structure, although not shown in detail, the layer may include a layered structure including a p-side first layer formed of a group III nitride semiconductor having a film thickness of 100 angstroms or less, and a p-side second layer having a different composition from that of the p-side first layer and formed of a group III nitride semiconductor having a film thickness of 100 angstroms or less. Further, the p-type cladding layer 6a may also include a structure in which the p-side first layer and the p-side second layer are layered repeatedly in an alternating arrangement.

The above-mentioned p-side first layer and p-side second layer may be formed, for example, from any one of AlGaN, GaInN and GaN, with a different composition for each layer. Further, the p-side first layer and p-side second layer may also be formed as a GaInN/GaN alternating structure, an AlGaN/GaN alternating structure, or a GaInN/AlGaN alternating structure. In the present embodiment, the p-side first layer and the p-side second layer preferably have either an AlGaN/AlGaN alternating structure or an AlGaN/GaN alternating structure.

The super-lattice layers of the p-side first layer and the p-side second layer are preferably 60 angstroms or less, are more preferably 40 angstroms or less, and are most preferably within a range of 10 to 40 angstroms, in each layer. If the film thickness of the p-side first layer and p-side second layer that form the super-lattice layers exceeds 100 angstroms, the layers tend to contain many crystal defects, which is undesirable.

The p-side first layer and the p-side second layer may be a doped structure, or may be a combination of a doped structure and an undoped structure, respectively. As the doping impurity, any of known impurities used for doping the above material compositions can be used without any limitation. For example, in a case where an AlGaN/GaN alternating structure or an AlGaN/AlGaN alternating structure having a different composition is used as the p-type cladding layer, Mg is preferred as the impurity. Further, the above-mentioned p-type super-lattice multilayer film may be prepared with the doping appropriately switched ON and OFF, even if the representative composition such as GaInN, AlGaN or GaN is the same.

As described above, by adopting a layer structure in which the p-type cladding layer 6a includes a super-lattice structure, the light-emitting device 1 having significantly improved light emission output and superior electrical characteristics can be obtained.

The p-type contact layer 6b is a layer used for providing a positive electrode. The p-type contact layer 6b is preferably formed of $Al_xGa_{1-x}N$ ($0 \leq x \leq 0.4$). An Al composition within the above range is preferred in view of maintaining a superior crystalline characteristic, and achieving a superior ohmic contact with a p-ohmic electrode. Incorporating a p-type impurity (dopant) at a concentration of $1 \times 10^{18}$ to $1 \times 10^{21}$/$cm^3$, and more preferably within a range of $5 \times 10^{19}$ to $5 \times 10^{20}$/$cm^3$, is preferred in view of maintaining a superior ohmic contact, preventing the occurrence of cracking, and maintaining a superior crystalline characteristic. There is no particular limitation to the p-type impurity, but Mg is preferred, for example. Although the film thickness of the p-type contact layer 6b is not particularly limited, it is preferable that the film thickness be within the range of 0.01 to 0.5 μm, and more preferably 0.05 to 0.2 μm. It is preferable that the film thickness of the p-type contact layer 6b be within this range in view of light emission output.

[Insulation Layer]

In the light-emitting device according to the present embodiment, on at least a part of the p-type semiconductor layer 6, that is, in an approximately central area in the light-emitting device 1 shown in FIGS. 1 and 2, the insulation layer 15 formed of an insulation material is provided. Further, in this example, the insulation layer 15 is formed to be covered with the light-transmitting electrode 7.

The material of the insulation layer 15 is not particularly limited, and any of known insulating oxide films may be used without any limitation. Here, silicon dioxide ($SiO_2$) may be preferably used.

In the related art, since a conductive thin film which forms the light-transmitting electrode 7 has electric current diffusion in a transverse direction (in-plane direction) which is smaller than electric current diffusion in a longitudinal direction (semiconductor layer direction), with a configuration in which the insulation layer 15 formed of the insulating material is not provided directly below, electric current concentration easily occurs directly below a bonding pad (positive electrode bonding pad 8) formed thereon. Thus, an area where the light emission effect can be obtained on the light-emitting layer 5 can only be directly below the bonding pad electrode, and light emission efficiency of light extracted from the light-emitting device is reduced, thereby making it difficult to obtain desired luminance.

In this embodiment, as shown in FIGS. 1 and 2, by forming the insulation layer 15 having such a configuration that is covered with the light-transmitting electrode 7 on the p-type semiconductor layer 6, the electric current diffusion in the film of the light-transmitting electrode 7 is facilitated. That is, in the light-transmitting electrode 8 and the semiconductor layer 20, electric current is mainly diffused to the vicinity of a position corresponding to the insulation layer 15 and the positive electrode bonding pad 8. Thus, the light emission effect can be suppressed in the position directly below the insulation layer 15 in the light-emitting layer 5, to thereby obtain a superior light emission effect in the vicinity thereof and the vicinity of the negative electrode bonding pad 9, thereby making it possible to enhance the light emission efficiency of light extracted from the light-emitting device. Accordingly, it is possible to realize the light-emitting device 1 with high internal quantum efficiency and superior light emission luminance.

Figure 5:
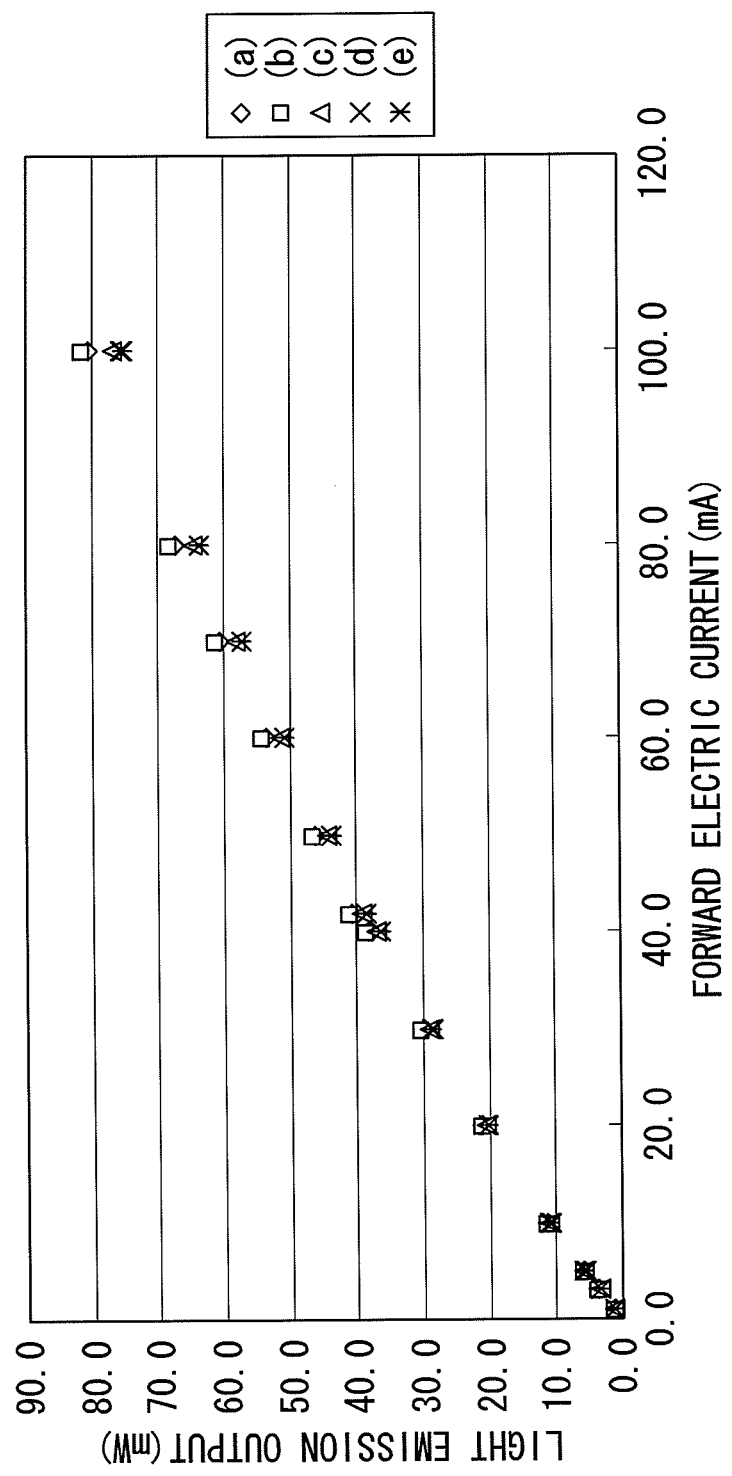
FIG. 5 is a diagram schematically illustrating an example of a group III nitride semiconductor light-emitting device according to the present invention, which is a graph illustrating the relationship between a forward electric current (I) and a light emission output (Po).

The effect obtained by suppressing the electric current concentration in the position corresponding to the insulation layer 15 and the positive electrode bonding pad 8 and by diffusing electric current in the vicinity thereof, by forming the insulation layer 15 directly below the bonding pad electrode (positive electrode bonding pad 8), will be described with reference to a graph of FIG. 5. FIG. 5 is a graph illustrating the relationship between a forward electric current (I) and a light emission output (Po) in the light-emitting device. In the graph, curves (a), (b), and (c) represent the characteristics of the light-emitting device in which the insulation layer is formed according to this embodiment. Further, in the graph of FIG. 5, curves (d) and (e) represent characteristics of the light-emitting device in which the insulation layer is not formed.

As shown in the graph in FIG. 5, it is obvious that the light-emitting device according to this embodiment in which the insulation layer is formed to diffuse electric current to the vicinity of the insulation layer and the positive electrode bonding pad can obtain a high light emission output (Po) even in a case where the forward electric current (I) is the same, compared with the light-emitting device in which the insulation layer is not formed. It is considered that this is because electric current is diffused in the vicinity of the position A corresponding to the insulation layer 15 and the positive electrode bonding pad 8, in the light-transmitting electrode 7 and the semiconductor layer 20, by forming the insulation layer 15 on the p-type semiconductor layer 6, and effective light emission occurs in the vicinity thereof.

The thickness of the insulation layer 15 is preferably within a range of 50 to 500 nm, and more preferably within a range of 100 to 300 nm. If the thickness of the insulation layer 15 is within the above-mentioned range, the effect of suppressing the above-mentioned electric current concentration can be more effectively obtained.

Further, the shape of the insulation layer 15 from a planar view is not particularly limited, and for example, an approximately circular shape, an approximately rectangular shape or the like may be appropriately selected and adopted. Here, in order to effectively diffuse electric current, the approximately circular shape or the like may be used. In this way, in a case where the insulation layer 15 is formed in the approximately circular shape from a planar view, its diameter is preferably formed to be larger than the diameter of the positive electrode bonding pad 8 within a range of 30 μm or less, and is more preferably formed to be larger than the diameter of the positive electrode bonding pad 8 within a range of 10 μm or less.

[Light-Transmitting Electrode]

The light-transmitting electrode 7 is a light-transmitting electrode formed of a conductive oxide film or the like, and a light transmission material usually used in this technical field may be used without any limitation. For example, ITO ($In_2O_3$—$SnO_2$), AZO ($ZnO$—$Al_2O_3$), IZO ($In_2O_3$—$ZnO$: Indium Zinc Oxide) and GZO ($ZnO$—$Ga_2O_3$), IGO ($In_2O_3$—$Ga_2O_3$), ICO ($In_2O_3$—$Ce_2O_3$), titanium oxide ($TiO_2$) which is doped with an arbitrary impurity element, or the like may be used as the material. Further, in the above-described materials, $TiO_{2-x}$ obtained by reducing a part of titanium oxide $TiO_2$ may be used as the titanium oxide, which is preferably conductive. Further, as a material to be doped with the titanium oxide, Nb or the like is used for example.

Further, in this embodiment, at least one of ITO, IZO, IGO, ICO and conductive titanium oxide is more preferably used.

Further, a method of forming the light-transmitting electrode 7 is not particularly limited, and may be formed by well-known means in this technical field. Further, the structure of the light-transmitting electrode 7 may be used without any limitation, including any known structure. Further, the light-transmitting electrode 7 may be formed to cover the entire surface of the insulation layer 15 and to cover approximately the entire surface of the p-type semiconductor layer 6, or may be formed in a lattice shape or tree shape with gaps therein. Furthermore, after formation of the light-transmitting electrode 9, a thermal annealing process for the purpose of alloying or increasing transparency may or may not be conducted.

In the light-emitting device 1 according to the present embodiment, the sheet resistance Rs2 of the n-type semiconductor layer 4 is lower than the sheet resistance Rs1 of the p-side light-transmitting electrode 7. With such a configuration, as described above, light emission in the semiconductor layer 20 (light-emitting layer 5) which is directly below the positive electrode bonding pad 8 is suppressed, and light emission in the vicinity of the negative electrode bonding layer 9 is suppressed. Thus, since the light-emitting layer 5 in the position around the positive electrode bonding pad 8 mainly emits light, light emission around the negative electrode bonding pad 9 formed on the n-type semiconductor layer 4 is suppressed. Further, since the area of the portion with high light emission intensity is enlarged around the positive electrode bonding pad 8 in which the light-emitting layer 15 is not removed, light extraction efficiency is enhanced. Further, since the film thickness of the light-transmitting electrode 7 can be formed to be thin, it is possible to enhance light transmittance, and to further enhance light extraction efficiency. Thus, it is possible to realize the light-emitting device 1 which has superior light emission efficiency and light extraction efficiency, and has high light emission intensity and electric characteristics.

It is preferable that the sheet resistance Rs1 of the light-transmitting electrode 7 be 30 Ω/sq or less. As described above, in a state where the sheet resistance Rs2 of the n-type semiconductor layer 4 is lower than the sheet resistance Rs1 of the p-side light-transmitting electrode 7, the sheet resistance Rs2 of the n-type semiconductor layer 4 is set to 15 Ω/sq or less, and the sheet resistance Rs1 of the light-transmitting electrode 7 is set to 30 Ω/sq or less, and thus, the enhancement effect of light extraction efficiency is stably obtained and a superior electric characteristic is obtained.

Further, a method of controlling the sheet resistance Rs1 of the light-transmitting electrode 7 is not particularly limited, and for example, a method of controlling the sheet resistance Rs1 by adjusting the film thickness or through an annealing process may be employed. As in this embodiment, in a case where the sheet resistance Rs1 of the light-transmitting electrode 7 is higher than the sheet resistance Rs2 of the n-type semiconductor layer 4, and the sheet resistance Rs1 is set to 30 Ω/sq or less, it is possible to obtain a desired characteristic, by forming the film thickness to be thin, for example.

It is preferable that the thickness of the light-transmitting electrode 7 be 100 nm or less. By adjusting the thickness of the light-transmitting electrode 7 in this way, it is possible to adjust the sheet resistance Rs1 to be 30 Ω/sq or less. Further, it is preferable that the largest thickness of the light-transmitting electrode 7 be 600 nm or less in consideration of productivity.

In the light-emitting device 1 according to this embodiment, it is more preferable that a surface of the light-transmitting electrode 7 be a rough surface. Thus, light extraction efficiency in the light-transmitting electrode 7 is enhanced and the shape or roughness is optimized, and thus, it is possible to control the sheet resistance Rs1 of the light-transmitting electrode 7.

[Bonding Pad (Electrode)]

In the light-emitting element 1 according to this embodiment, the positive electrode bonding pad 8 is formed on the light-transmitting electrode 7, and the negative electrode bonding pad 9 is formed to be in contact with the n-type contact layer included in the n-type semiconductor layer 4.

[Positive Electrode Bonding Pad]

As shown in FIGS. 1 and 2, the positive electrode bonding pad 8 is formed on a part of the light-transmitting electrode 7 including a light transmission conductive oxide film being in contact with the p-type semiconductor layer 6 and the insulation layer 15. Further, the positive electrode bonding pad 8 in this example is formed on the position A corresponding to the insulation layer 15, on a surface 7a of the light-transmitting electrode 7.

The positive electrode bonding pad 8 is formed to be electrically connected with a circuit board, a lead frame or the like. As the positive electrode bonding pad, a variety of structures using Au, Al, Ni, Cu and the like are already known, and these known materials and structures may be used without any limitation.

It is preferable that the thickness of the positive electrode bonding pad 8 be within a range of 100 to 1500 nm. Further, in view of characteristics of the bonding pad, since bondability is enhanced as the thickness is large, the thickness of the positive electrode bonding pad 8 is more preferably 300 nm or more.

In the light-emitting device 1 according to this embodiment, as described above, it is preferable that the positive electrode bonding pad 8 be formed on the position A corresponding to the insulation layer 15 on the surface 7a of the light-transmitting electrode 7. With such a configuration, it is possible to stably obtain the effect of suppressing the electric current concentration and the effect of suppressing light absorption in the positive electrode bonding pad 8 or light loss due to multiple reflection therein, as described above. Further, in the light-emitting device 1 according to this embodiment, by suppressing the electric current concentration directly below the positive electrode bonding pad 8, it is possible to obtain the effect of enhancing the light emission output (Po), in particular, in a case where the light-emitting device is driven with high electric current.

In this embodiment, for example, a through-hole (not shown) may be formed in the position "A" corresponding to the insulation layer 15 on the surface 7a of the light-transmitting electrode 7, and the positive electrode bonding pad 8 may be formed being in contact with the insulation layer 15 through the through-hole. With such a configuration, the joint strength of the positive electrode bonding pad 8 is enhanced.

[Negative Electrode Bonding Pad]

The negative electrode bonding pad 9 is formed to be in contact with the n-type semiconductor layer 4 of the semiconductor layer 20. Thus, when the negative electrode bonding pad 9 is formed, the n-type contact layer of the n-type semiconductor layer 4 is exposed by removing a part of the light-emitting layer 5 and the p-type semiconductor layer 6, and then the negative electrode bonding pad 9 is formed thereon.

As the negative electrode bonding pad 9, a variety of known compositions or structures may be used without any limitation. Further, well-known means in this technical field may be used.

Formation positions or distance between electrode centers of the above-described positive electrode bonding pad 8 and the negative electrode bonding pad 9 in the light-emitting device 1 are not limited. However, in order to achieve higher light emission efficiency and light extraction efficiency, it is preferable to appropriately adjust the formation positions and the distance between electrode centers of the respective bonding pads. For example, as shown in FIGS. 1 and 2, in a case where the light-emitting device 1 is formed in an approximately rectangular shape from a planar view, it is preferable that the negative electrode bonding pad 9 be firstly disposed near one end side of the light-emitting device 1 in a length direction, and the positive electrode bonding pad 8 be disposed in an approximately central area of the light-emitting device 1 or near the other end side thereof in a length direction, so as to easily obtain high light emission efficiency and light extraction efficiency, as described above.

In this embodiment, as described above, the sheet resistance Rs2 of the n-type semiconductor layer 4 included in the semiconductor layer 20 is lower than the sheet resistance Rs1 of the light-transmitting electrode 7. Thus, the light-emitting layer 5 and the p-type semiconductor layer 6 are connected through the n-type semiconductor layer 4 from the negative electrode bonding pad 9, and thus, electric current concentration is suppressed when electric current flows in the light-transmitting electrode 7, thereby making it possible to realize the light-emitting device 1 with superior light emission efficiency.

[Chip Size of Light Emitting Device from a Planar View]

In this embodiment, the chip size of the light-emitting device 1 from a planar view, that is, an electrode separation direction size (chip length) L in a direction where the positive electrode bonding pad 8 and the negative electrode bonding pad 9 are separated, and a chip width (W) in a direction perpendicular to the electrode separation direction are not particularly limited. For example, the electrode separation direction size L and the chip width W may have a size proportion in which the chip shape is square from a planar view, or may have a size proportion in which the chip shape is rectangular. In either case, it is possible to enhance the light emission efficiency according to this embodiment.

However, in order to further enhance the light emission efficiency with such a configuration, as in the example shown in FIG. 2, it is more preferable that the shape from a planar view be selected so that the electrode separation direction size L is longer than the chip width W to have an approximately rectangular shape.

According to this embodiment, in a case where the light-emitting device 1 includes the insulation layer 15 with such a configuration and the sheet resistance Rs2 of the n-type semiconductor layer 4 is lower than the sheet resistance Rs1 of the light-transmitting electrode 7, a drive electric current (forward electric current) IF to be used is preferably within a range of about 30 mA to about 100 mA. The light-emitting device driven under such a condition is used for illumination using a reflector or the like or a headlamp or the like, for example. In this way, the light-emitting device 1 is driven with a relatively large amount of electric current and has high light emission intensity, which is preferably used as the above-mentioned illumination or the like.

A more preferable chip size in a case where the light-emitting device 1 is driven under the above-described condition will be described in detail hereinafter.

By setting the electrode separation direction size L from a planar view to 400 μm or more, more preferably within a range of 400 to 550 μm, and by setting the chip width W to 180 μm or more, more preferably within a range of 180 to 260 μm, the light-emitting device 1 according to this embodiment may be formed in the approximately rectangular shape from a planar view. In this case, for example, the chip size (W×L) from a planar view may be a combination such as 260×550 μm, 240×400 μm or 180×400 μm.

In this embodiment, when the light-emitting device 1 to which a large amount of drive electric current (forward electric current) IF is applied for use employs the chip size and shape as described above, light emission in the semiconductor layer 20 (light-emitting layer 5) directly below the positive electrode bonding pad 8 is more effectively suppressed, and also, light emission around the negative electrode bonding pad 9 is more effectively suppressed. Thus, the light-emitting layer 5 in the position in the vicinity of the positive electrode bonding pad 8 mainly emits light effectively, whereas light emission around the negative electrode bonding pad 9 formed on the n-type semiconductor layer 4 is further suppressed. Accordingly, since the area of the portion where light emission intensity is high is enlarged around the positive electrode bonding pad 8 in which the light-emitting layer 15 is not removed, the light emission efficiency is further enhanced.

Further, in this embodiment, in a state where the aspect ratio of the light-emitting device 1, that is, the electrode separation direction size L× the chip width W is set within the above-described range, it is preferable that the area from a planar view be set to about 180,000 μm$^2$ or less, to thereby noticeably enhance the light emission efficiency. For example, in a case where the chip size (W×L) is 280×550 μm, the area from a planar view becomes 154,000 μm$^2$; in a case where the chip size (W×L) is 260×550 μm, the area from a planar view becomes 143,000 μm$^2$; in a case where the chip size (W×L) is 240×400 μm, the area from a planar view becomes 96,000 μm$^2$; and in a case where the chip size (W×L) is 180×400 μm, the area from a planar view becomes 72,000 μm$^2$.

Generally, it can be understood that as the area of the light-emitting device from a planar view is large, the sheet resistance Rs2 of the n-type semiconductor layer 4 is low. In this embodiment, particularly, in the case of the light-emitting device to which a large amount of electric current is applied for driving and in which an area from a planar view, that is, a light emission area is large, the sheet resistance Rs2 of the n-type semiconductor layer 4 is lower than the sheet resistance Rs1 of the light-transmitting electrode 7, and thus, it is possible to more noticeably enhance the light emission efficiency.

Further, in this embodiment, in a state where the electrode separation direction size L× the chip width W of the light-emitting device 1 and the area from a planar view are set within the above-described ranges, it is preferable that the aspect ratio from a planar view, that is, (electrode separation direction size L)/(chip width W) be set within a range of 1.5 to 2.7, to thereby noticeably enhance the light emission efficiency. For example, in a case where the chip size (L×W) is 280×550 μm, the aspect ratio (L/W) becomes 2.0.

The above-described distance between electrode centers of the positive electrode bonding pad 8 and the negative electrode bonding pad 9 is limited by the electrode separation direction size L of the light-emitting device 1. In this embodiment, in a state where the size of the light-emitting device 1 from a planar view and the shape thereof are set under the above-described condition, it is preferable that the distance between electrode centers be set within a range of {electrode separation direction size of light-emitting device L×0.5 to 0.75}, to thereby obtain the noticeable effect according to the embodiment, and to obtain higher light emission efficiency without blurred light emission or the like.

Here, as in the example described in this embodiment, in a case where a large amount of drive electric current (forward electric current) IF is applied to the light-emitting device, in general, there is a characteristic that blurred light emission of the light-emitting device from a planar view easily occurs. Such blurred light emission may occur even in a case where the distance between electrode centers of the positive electrode bonding pad 8 and the negative electrode bonding pad 9 is appropriately adjusted.

In the light-emitting device according to this embodiment, since the sheet resistance Rs2 of the n-type semiconductor layer 4 is lower than the sheet resistance Rs1 of the light-transmitting electrode 7, it is possible to prevent the blurred light emission even in the light-emitting device to which a large amount of forward electric current IF is applied for use.

According to the light-emitting device 1 according to this embodiment, as described above, since the semiconductor layer 20 in which the n-type semiconductor layer 4, the light-emitting layer 5 and the p-type semiconductor layer 6 are sequentially layered is formed on the single-crystal underlayer 3 which is formed on the substrate 11; the light-transmitting electrode 7 is formed on the p-type semiconductor layer 6; the insulation layer 15 is formed on at least a part of the p-type semiconductor layer 6, and the light-transmitting electrode 7 is formed to cover the insulation layer 15; and the positive electrode bonding pad 8 is provided in the position A above the insulation layer 15 provided on the p-type semiconductor layer 6, on the surface 7a of the light-transmitting electrode 7, electric current concentration can be suppressed in the position of the light-transmitting electrode 7 and the semiconductor layer 20 corresponding to the positive electrode bonding pad 8, to thereby enhance light emission efficiency. Further, since the sheet resistance Rs2 of the n-type semiconductor layer 4 is lower than the sheet resistance Rs1 of the light-transmitting electrode 7, light emission in the proximity of the negative electrode bonding pad 9 which is provided on the n-type semiconductor layer 4 is suppressed. Further, around the positive electrode bonding pad 8 where the light-emitting layer 15 is not removed, since the area of the portion in which light emission intensity is high is enlarged, light extraction efficiency is enhanced. Further, since the film thickness of the light-transmitting electrode 7 can be formed to be thin, it is possible to enhance light transmittance, and to further enhance light extraction efficiency. Thus, it is possible to provide the light-emitting device 1 which has superior light emission efficiency and light extraction efficiency, high exterior quantum efficiency, and superior electric characteristics.

Figure 3:
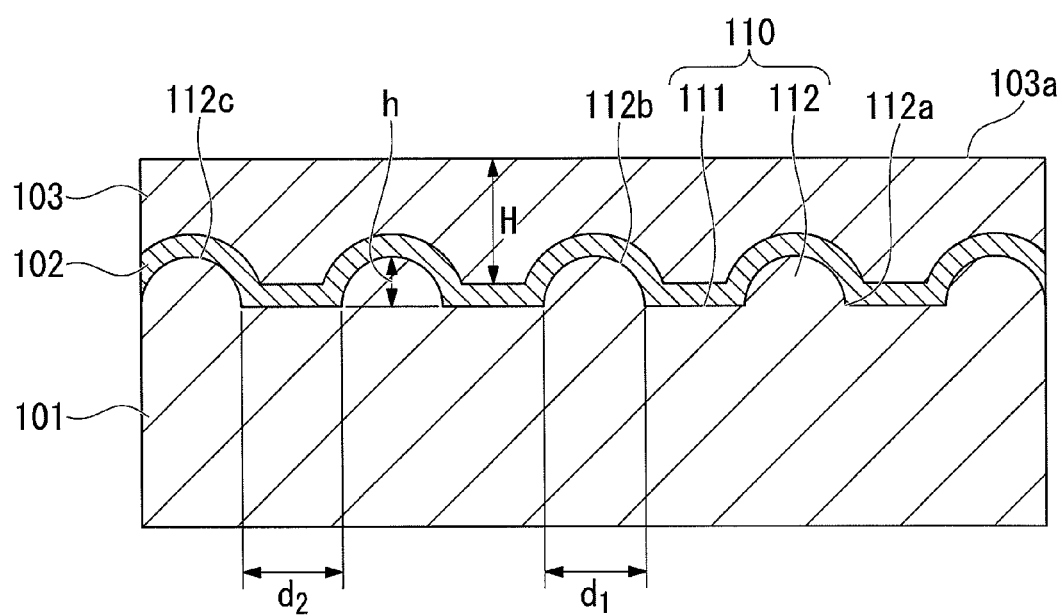
FIG. 3 is a diagram schematically illustrating another example of a group III nitride semiconductor light-emitting device according to the present invention, which is a cross-sectional diagram showing a layered structure in which a buffer layer and a underlayer formed of a single-crystal group III nitride semiconductor are formed on a main surface of a substrate.
Figure 4:
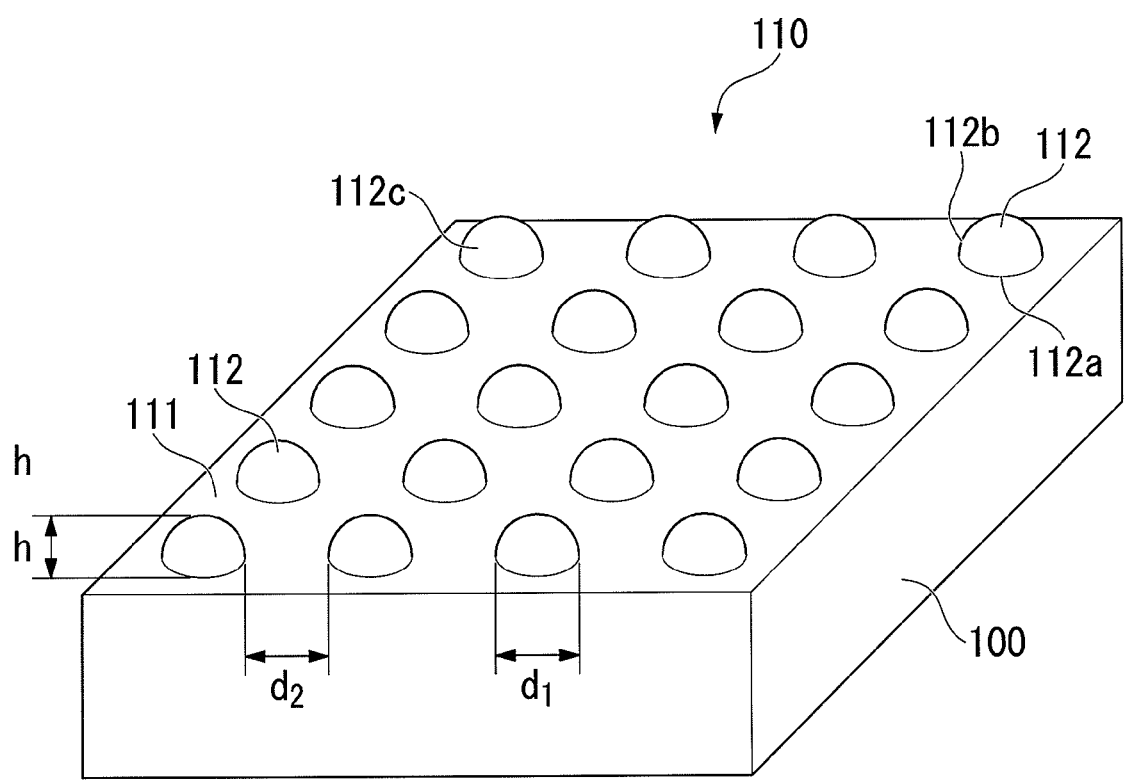
FIG. 4 is a diagram schematically illustrating still another example of a group III nitride semiconductor light-emitting device according to the present invention, which is a perspective view showing a main part in FIG. 3.

In the light-emitting device according to this embodiment, for example, as shown in FIGS. 3 and 4, a substrate 100 which includes a main surface 110 having a flat surface 111 formed as a (0001) C plane and a plurality of convex portions 112 may be employed, and a underlayer 103 may be formed by epitaxially growing the group III nitride semiconductor to cover the flat surface 111 and the convex portions 112 on the main surface 110.

The plurality of convex portions 112 is formed on a substrate 11A in the example shown in FIGS. 3 and 4. Further, in a portion where the convex portion 112 is not formed on the main surface 110 of the substrate 100 is the flat surface 111 formed as the (0001) C plane. Accordingly, as in the example shown in FIGS. 3 and 4, the main surface 110 of the substrate 100 includes the flat surface 111 formed as the C plane and the plurality of convex portions 112.

As shown in the figure, the convex portion 112 is formed of a surface 112c which is not parallel to the C plane, and the C plane does not extend on the surface 112c. The convex portion 112 has an approximately circular shape of the base portion 112a from a planar view, which has a semicircular shape in which the outer size becomes gradually smaller as it goes upward and a side surface 112b is outwardly curved. In a case where the convex portion is formed of oxide or nitride other than sapphire (as will be described in detail later), a columnar shape may be used for the convex portion 112. Further, the convex portions 112 are arranged at regular intervals in a checkerboard shape, from a planar view.

The convex portion 112 has a base width $d_1$ of 0.05 to 1.5 μm, a height h of ¼ or more of the base width $d_1$ within a range of 0.05 to 1 μm, and an interval $d_2$ between adjacent convex portions 112 of 0.3 to 5 times the base width $d_1$. Here, the base width $d_1$ of the convex portion 112 refers to the largest width in a bottom (base portion 12a) of the convex portion 112. Further, the interval $d_2$ between the adjacent convex portions 112 refers to the distance between edges of the base portions 112a of the closest convex portions 112.

It is preferable that the interval $d_2$ between the adjacent convex portions 112 be 0.05 to 5 times the base width $d_1$. If the interval $d_2$ between the adjacent convex portions 112 is smaller than 0.3 times the base width $d_1$, when the underlayer 103 which forms the n-type semiconductor layer 4 (semiconductor layer 20) is epitaxially grown, it is difficult to facilitate crystal growth from the flat surface 111 formed from the C plane, and thus, it may be difficult to completely cover the convex portions 112 by the underlayer 103, or a desired level of flatness of the surface 103a of the underlayer 103 may not be achieved. Accordingly, in a case where crystals of the semiconductor layer which forms the LED structure are formed on the underlayer 103 by covering the convex portions 112, the crystals are formed with a large amount of pits. Thus, output, electric characteristics or the like of the formed group III nitride semiconductor light-emitting device deteriorates. Further, if the interval $d_2$ between the convex portions 112 exceeds 5 times the base width $d_1$, in a case where the group III nitride semiconductor light-emitting device is formed using the substrate 100, the opportunity for diffuse reflection of light in an interface between the substrate 100 and the group III nitride semiconductor layer formed on the substrate 100 is reduced, and thus light extraction efficiency may not be sufficiently enhanced.

It is preferable that the base width $d_1$ be 0.05 to 1.5 μm. If the base width $d_1$ is smaller than 0.05 μm, in a case where the group III nitride semiconductor light-emitting device is formed using the substrate 100, light diffuse reflection may not be sufficiently conducted. Further, if the base width $d_1$ exceeds 1.5 μm, it is difficult to epitaxially grow the underlayer 1033 by covering the convex portions 112. Further, even though the underlayer is formed with superior flatness and a crystal characteristic, distortion between the underlayer and the light-emitting layer increases, and thus internal quantum efficiency may be reduced. Further, as the base width $d_1$ is small within the above-described range, light emission output of the light-emitting device may be further enhanced. Further, it is more preferable that the base width $d_1$ be 0.05 to 1 μm.

It is preferable that the height h of the convex portion 112 be 0.05 to 1 μm. If the height h of the convex portion 112 is smaller than 0.05 μm, in a case where the group III nitride semiconductor light-emitting device is formed using the substrate 100, light diffuse reflection may not be sufficiently conducted. Further, if the height h of the convex portion 112 exceeds 1 μm, it is difficult to epitaxially grow the underlayer 103 by covering the convex portions 112, and thus, a desired level of flatness of the surface of the underlayer 103 may not be achieved.

Further, it is preferable that the height h of the convex portion 112 be ¼ or more of the base width $d_1$. If the height h of the convex portion 112 is smaller than ¼ of the base width $d_1$, in a case where the group III nitride semiconductor light-emitting device is formed using the substrate 100, the effect of light diffuse reflection or light extraction efficiency enhancement may not be sufficiently obtained.

The shape of the convex portion 112 is not limited to the example shown in FIGS. 3 and 4, and any shape may be used as long as it includes the surface which is not parallel to the C plane. For example, the planar shape of the base is an approximately polygonal shape, in which the outer size becomes gradually smaller as it goes upward and a side surface 111 is outwardly curved. Further, the shape may be an approximately conical shape or pyramidal shape a side surface of which is formed of an inclined surface in which the outer size becomes gradually smaller as it goes upward. Further, the shape may be a shape in which an inclined angle of a side surface is changed at two stages. Further, in a case where the convex portion is formed of oxide or nitride other than sapphire (as will be described in detail later), a columnar shape may be used for the convex portion. Further, the convex portions 12 may be arranged at regular or irregular intervals from a planar view, without limitation to the example as shown. Further, the planar arrangement of the convex portions 112 may be a rectangular shape, a triangular shape, or a random shape.

Further, the convex portions 112 provided on the substrate 100 may be formed by etching the substrate 100 by a method of manufacturing (which will be described in detail later), but is not limited thereto. For example, the convex portions may be formed by accumulating a different material which forms the convex portions on the C plane of the substrate 100, on the substrate. As the method of accumulating the different material which forms the convex portions, for example, a variety of methods such as sputtering, deposition or CVD may be used. Further, as the material which forms the convex portions, a material having approximately the same refraction index as that of the material of the substrate, such as oxide or nitride, may be preferably used. In a case where the substrate is formed of sapphire, for example, $SiO_2$, $Al_2O_3$, SiN, ZnO or the like may be used as the material which forms the convex portions.

As described above, as the substrate 100 is formed to have such a configuration that the main surface 110 includes the flat surface 111 and the convex portions 112, the interface between the substrate 100 and the underlayer 103 (which will be described in detail later) becomes uneven through the buffer layer 102, and thus, light confinement within the light-emitting device may be reduced due to the light diffuse reflection, thereby making it possible to realize a light-emitting device with superior light extraction efficiency.

[Method of Manufacturing Group III Nitride Semiconductor Light Emitting Device]

A method of manufacturing the group III nitride semiconductor light-emitting device according to this embodiment is a method which includes an epitaxial step of forming the single-crystal underlayer (group III nitride semiconductor layer) 3 on the main surface 11a of the substrate 11; a semiconductor layer forming step of forming the semiconductor layer 20 by sequentially layering the n-type semiconductor layer 4, the light-emitting layer 5 and the p-type semiconductor layer 6 on the underlayer 3; and a light-transmitting electrode forming step of forming the light-transmitting electrode 7 on the p-type semiconductor layer 6. In the light-transmitting electrode forming step, the insulation layer 15 is formed on at least a part of the p-type semiconductor layer 6, and the light-transmitting electrode 7 is then formed to cover the insulation layer 15 on the p-type semiconductor layer 6. The method further includes a positive electrode forming step of forming the positive electrode bonding pad 8 in the position "A" above the insulation layer 15 formed on the p-type semiconductor layer 6, on the surface 7a of the light-transmitting electrode 7, after the light-transmitting electrode forming step. In the semiconductor layer forming step, the n-type semiconductor layer 4 is formed so that the sheet resistance of the n-type semiconductor layer 4 is lower than the sheet resistance of the light-transmitting electrode 7.

Hereinafter, each step included in the method of manufacturing according to this embodiment will be described in detail.

[Buffer Layer Forming Step]

In the method of manufacturing according to this embodiment, the buffer layer forming step of forming the buffer layer 2 on the main surface 11a of the substrate 11 is preferably prepared before the epitaxial step. Further, in this embodiment, since a configuration in which the buffer layer is omitted may be adopted, the buffer layer forming step may not be performed in such a case.

[Pretreatment of Substrate]

In this embodiment, it is preferable to perform pretreatment using a reverse sputtering method or the like through plasma treatment, after introduction of the substrate 11 in a chamber of a sputtering apparatus, and before formation of the buffer layer 2.

[Formation of Buffer Layer]

After performing the pretreatment for the substrate 11, the buffer layer 2 having a composition of $Al_xGa_{1-x}N$ ($0 \leq x \leq 1$) is formed on the main surface 11a of the substrate 11 by a reactive sputtering method. In a case where the buffer layer 2 having a single-crystal structure is formed through the reactive sputtering method, the ratio of the flow rate of nitrogen to the flow rate of nitrogen material and inert gas within the chamber of the sputtering apparatus is preferably controlled so that the nitrogen material is within a range of 50% to 100%, and more preferably about 75%. Further, in a case where the buffer layer 2 having a columnar crystal (polycrystal) structure is formed, the ratio of the nitrogen flow rate to the flow rate of the nitrogen material and the inert gas within the chamber of the sputtering apparatus is preferably controlled so that the nitrogen material is within a range of 1% to 50%, and more preferably about 25%.

Further, the buffer layer may be formed not only by the reactive sputtering method as mentioned above, but also by the MOCVD method. However, it is preferable to form the buffer layer 2 by the reactive sputtering method in view of process simplification or the like.

[Epitaxial Step and Semiconductor Layer Forming Step]

Next, in the epitaxial step, after the above-mentioned buffer layer forming step, as shown in FIG. 1, the single-crystal group III nitride semiconductor is epitaxially grown on the buffer layer 2 formed on the main surface 11a of the substrate 11, to thereby form the underlayer (group III nitride semiconductor layer) 103 to cover the main surface 11a.

Further, in this embodiment, after formation of the underlayer 3 of the group III nitride semiconductor in the epitaxial step, the semiconductor layer 20 including the respective layers of the n-type semiconductor layer 4, the light-emitting layer 5, and the p-type semiconductor layer 6 is formed on the underlayer 3 in the semiconductor layer forming step.

In this embodiment, in the epitaxial step and the semiconductor layer forming step in which the respective layers are formed using the group III nitride semiconductor, description of a configuration which is common to both the steps may be partially omitted.

In this embodiment, there is no particular limitation to the method of growing the gallium nitride-based compound semiconductor (group III nitride semiconductor) when forming the underlayer 3, the n-type semiconductor layer 4, the light-emitting layer 5 and the p-type semiconductor layer 6, and any of known methods of growing a nitride semiconductor, such as reactive sputtering, MOCVD (metalorganic chemical vapor deposition), HVPE (hydride vapor phase epitaxy), and MBE (molecular beam epitaxy), may be applied. Among these methods, in the MOCVD method, hydrogen ($H_2$) or nitrogen ($N_2$) may be used as a carrier gas, trimethylgallium (TMG) or triethylgallium (TEG) may be used as a source of Ga which is a group III material, trimethylaluminum (TMA) or triethylaluminum (TEA) may be used as a source of Al, trimethylindium (TMI) or triethylindium (TEI) may be used as a source of In, and ammonia ($NH_3$) or hydrazine ($N_2H_4$) may be used as a source of N which is a group V material. Further, in view of an n-type dopant, monosilane ($SiH_4$) or disilane ($Si_2H_6$) may be used as a Si material, and germane gas ($GeH_4$) or an organogermanium compound such as tetramethylgermanium (($CH_3)_4Ge$) or tetraethylgermanium (($C_2H_5)_4Ge$) may be used as a Ge material. In the MBE method, elemental germanium may be used as a dopant source. In view of a p-type dopant, for example, biscyclopentadienyl magnesium ($Cp_2Mg$) or bis-ethylcyclopentadienyl magnesium ($EtCp_2Mg$) may be used as a Mg material.

Further, the gallium nitride-based compound semiconductor as described above may contain another group III element in addition to Al, Ga and In. In addition, the gallium nitride-based compound semiconductor may also contain dopant elements such as Ge, Si, Mg, Ca, Zn, and Be, as necessary. Furthermore, the semiconductor may include not only elements that have been intentionally added, but also impurities that are unavoidably incorporated according to the film formation conditions or the like, as well as a trace of impurities contained in raw materials and reaction tube materials.

In this embodiment, among the respective methods described above, it is preferable to employ the MOCVD method in view of obtaining a film with a superior crystalline characteristic. In this embodiment, an example will be described in which the MOCVD method is employed in the epitaxial step and the semiconductor layer forming step.

[Epitaxial Step (Formation of Underlayer)]

In the epitaxial step, as shown in FIG. 1, the underlayer 3 is formed on the buffer layer 2 formed on the substrate 11, by the known MOCVD method.

In this embodiment, the MOCVD method is used for forming the underlayer 3, but the method of layering the underlayer 3 is not particularly limited, and any method can be used without limitation as long as it is a crystal growing method capable of dislocation looping. In particular, the MOCVD method, the MBE method, or the VPE method is suitable since these methods can cause migration to thereby enable formation of a film exhibiting a superior crystalline characteristic. Among these methods, the MOCVD method is more preferable since a film exhibiting a particularly superior crystalline characteristic can be obtained.

The temperature of the substrate 11 when the underlayer 3 is formed, that is, the formation temperature of the underlayer 3 is preferably 800° C. or more. This is because increasing the temperature of the substrate 11 during the film formation of the underlayer 3 facilitates atom migration to thereby facilitate dislocation looping. Thus, the temperature is more preferably 900° C. or more, and most preferably 1,000° C. or more. Further, the temperature of the substrate 11 when the underlayer 3 is formed should be lower than the temperature at which crystals are decomposed, and is preferably less than 1,200° C. If the temperature of the substrate 11 is within the above-mentioned range during the formation of the underlayer 3, it is possible to obtain the underlayer 3 with a superior crystalline characteristic.

The underlayer 3 may be formed by doping an impurity as necessary, but an undoped layer is preferred in view of improving a crystalline characteristic.

Further, it is also possible to form the underlayer 3 formed of the group III nitride semiconductor using the reactive sputtering method. In a case where the sputtering method is used, the apparatus can be simplified, compared with the MOCVD method, the MBE method or the like.

[Semiconductor Layer Forming Step]

Next, in the semiconductor layer forming step after the epitaxial step, as shown in FIG. 1, the semiconductor layer 20 including the respective layers of the n-type semiconductor layer 4, the light-emitting layer 5 and the p-type semiconductor layer 6 is layered on the underlayer 3, using the known MOCVD method.

(Formation of N-Type Semiconductor Layer)

The n-type semiconductor layer 4 is formed by sequentially layering the n-type contact layer 4a and the n-type cladding layer 4b on the underlayer 3 formed in the epitaxial step, using the known MOCVD method. As the film formation apparatus for forming the n-type contact layer 4a and the n-type cladding layer 4b, it is possible to employ an MOCVD apparatus which is used for forming the above-mentioned underlayer 3 or the light-emitting layer 5 (which will be described later) by appropriately changing a variety of conditions. In addition, it is also possible to form the n-type contact layer 4a and the n-type cladding layer 4b by the reactive sputtering method.

In this embodiment, in the semiconductor layer forming step, the n-type semiconductor layer 4 is formed so that the sheet resistance Rs2 of the n-type semiconductor layer 4 is lower than the sheet resistance Rs1 of the light-transmitting electrode 7 formed in the subsequent light-transmitting electrode forming step. Further, in the semiconductor layer forming step, the n-type semiconductor layer 4 is formed so that the sheet resistance Rs2 is 15 Ω/sq or less, for example.

As a method of controlling the sheet resistance Rs2 of the n-type semiconductor layer 4 in this way, as described above, it is possible to suitably adopt a method of appropriately adjusting the film thickness or a method of controlling the doping amount of the n-type impurities such as Si. In this embodiment, since the n-type semiconductor layer 4 is formed so that the sheet resistance Rs2 is reduced, as described above, it is preferable that the doping amount of the n-type impurities such as Si be about 1.5 times the doping amount in the light-emitting device in the related art. By increasing the doping amount of the n-type impurities, the n-type semiconductor layer 4 can be formed while controlling the sheet resistance Rs2 to be 15 Ω/sq or less, for example.

(Formation of Light Emitting Layer)

Subsequently, the light-emitting layer 5 is formed on the n-type cladding layer 4b (n-type semiconductor layer 4) through the known MOCVD method. The light-emitting layer 5 formed according to the present embodiment, as illustrated in FIG. 4, has a layered structure starting with a GaN barrier layer and ending with another GaN barrier layer, and is formed by alternately layering 7 layers of barrier layers 5a formed of GaN and 6 layers of well layers 5b formed of undoped $Ga_{0.8}In_{0.2}N$. Further, in the method of manufacturing the present embodiment, the light-emitting layer 5 can be formed by using the same film formation apparatus (MOCVD apparatus) as that used for forming the above-described n-type semiconductor layer 4.

(Formation of P-Type Semiconductor Layer)

Subsequently, the p-type semiconductor layer 6 formed of the p-type cladding layer 6a and the p-type contact layer 6b is formed, using the known MOCVD method, on the light-emitting layer 5, that is, on the barrier layer 5a which is the uppermost layer of the light-emitting layer 5. The same MOCVD apparatus as that used for forming the n-type semiconductor layer 4 and the light-emitting layer 5 can be used for forming the p-type semiconductor layer 6 while appropriately changing a variety of film formation conditions. In addition, it is also possible to form the p-type cladding layer 6a and the p-type contact layer 6b which form the p-type semiconductor layer 6 by using the reactive sputtering method.

In the present embodiment, the p-type cladding layer 6a formed of Mg-doped $Al_{0.1}Ga_{0.9}N$ is firstly formed on the light-emitting layer 5 (the uppermost barrier layer 5a), and then the p-type contact layer 6b formed of Mg-doped $Al_{0.02}Ga_{0.98}N$ is formed thereon. Here, the same MOCVD apparatus can be used for layering the p-type cladding layer 6a and the p-type contact layer 6b. As described above, for example, Mg, Zn or the like can be used as the p-type impurity in a similar manner.

[Light-Transmitting Electrode Forming Step]

Subsequently, in the light-transmitting electrode forming step, as shown in FIG. 1, the insulation layer 15 is formed on at least a part of the p-type semiconductor layer 6, and the light-transmitting electrode 7 is then formed to cover the insulation layer 15 on the p-type semiconductor layer 6.

[Formation of Insulation Layer]

The insulation layer 15 formed of an insulation material is formed on at least a part of the p-type semiconductor layer 6, around an approximately central area in the example shown in FIGS. 1 and 2.

There is no particular limitation to the material used for forming the insulation layer 15, and any known conductive oxide film may be used without any limitation, and for example, silicon dioxide ($SiO_2$) may be used.

Further, as a method of forming the insulation layer 15, for example, a known method such as sputtering may be used without any limitation.

[Formation of Light-Transmitting Electrode]

Next, IZO is layered to cover the insulation layer 15 on the p-type semiconductor layer 6 formed in the above-described way, to thereby form the light-transmitting electrode 7.

There is no particular limitation on the method of forming the light-transmitting electrode 7, and thus the light-transmitting electrode 7 can be formed by known means in this technical field. Further, as the structure thereof, any structure may be used without any limitation, including any known structure.

The light-transmitting electrode 7 may be formed of a different material such as ITO, ITO, IGO, ICO, AZO, GZO or conductive titanium oxide (for example, $TiO_2$ doped with Nb), instead of IZO. Further, after the light-transmitting electrode 7 is formed, a thermal annealing process for the purpose of alloying or increasing transparency may or may not be conducted.

In the light-transmitting electrode forming step according to this embodiment, it is more preferable to form unevenness on the surface 7a of the light-transmitting electrode 7. Thus, light extraction efficiency in the light-transmitting electrode 7 is enhanced. Further, by appropriately adjusting the shapes or sizes of the concaves and convexes, it is possible to control the sheet resistance Rs1 of the light-transmitting electrode 7.

In the method of manufacturing according to this embodiment, in the above-described semiconductor layer forming step, the sheet resistance Rs2 of the n-type semiconductor layer 4 is formed to be lower than the sheet resistance Rs1 of the light-transmitting electrode 7. Further, in the light-transmitting electrode forming step, it is necessary that the sheet resistance Rs2 of the n-type semiconductor layer 4 be formed to be lower than the sheet resistance Rs1 of the light-transmitting electrode 7 while adjusting the sheet resistance Rs1 to be 30 Ω/sq or less, for example. To this end, the film thickness of the light-transmitting electrode 7 is formed to be 100 nm or more and 600 nm or less, for example, so that the sheet resistance Rs1 of the light-transmitting electrode 7 can be controlled to be 30 Ω/sq or less.

As a method of controlling the sheet resistance Rs1 of the light-transmitting electrode 7, there is a method of reducing the resistance value by performing an annealing process in addition to a method of appropriately adjusting the film thickness. In this way, in a case where the annealing process is performed for the light-transmitting electrode 7, it is preferable to perform the annealing process under the condition that a temperature range is 500° C. or higher and 900° C. or lower under a nitrogen atmosphere. Thus, a crystalline texture of the light-transmitting electrode 7 becomes hexagonal crystals, and it is thus possible to control the sheet resistance Rs1 as a desired resistance value while effectively reducing the sheet resistance Rs1. Here, if the annealing temperature exceeds 900° C., the crystalline texture of the light-transmitting electrode formed of IZO becomes cubic crystals, and thus, it is difficult to appropriately control the sheet resistance Rs1.

By employing the above-described respective methods, the sheet resistance Rs1 of the light-transmitting electrode 7 is maintained to be 30 Ω/sq or less, for example, and the relationship between the sheet resistances Rs1 and Rs2 of the light-transmitting electrode 7 and the n-type semiconductor layer 4 is easily controlled according to the relationship represented by the expression (Rs1>Rs2).

[Formation of Bonding Pad Electrode]

Next, in the method of manufacturing according to this embodiment, in a positive electrode forming step after the light-transmitting electrode forming step, the positive electrode bonding pad 8 is formed in the position "A" corresponding to the insulation layer 15 formed on the p-type semiconductor layer 6 on the surface 7a of the light-transmitting electrode 7. Further, in this embodiment, the n-type semiconductor layer 4 is exposed by etching-removing a predetermined position of the semiconductor layer 20 to thereby form an exposed area, and then the negative electrode bonding pad 9 is formed on the exposed area.

[Positive Electrode Forming Step]

Firstly, the positive electrode bonding pad 8 is formed in the position "A" corresponding to the insulation layer 15 formed on the p-type semiconductor layer 6 on the surface 7a of the light-transmitting electrode 7. The positive electrode bonding pad 8 can be formed by sequentially layering respective materials of Ti, Al and Au from the surface of the light-transmitting electrode 7 by a known method, for example.

[Formation of Negative Electrode Pad]

When the negative electrode bonding pad 9 is formed, firstly, a part of the p-type semiconductor layer 6, the light-emitting layer 5 and the n-type semiconductor layer 4 which are formed on the substrate 11 is removed by a method such as dry etching, to thereby expose a part of the n-type contact layer 4a. Further, for example, by sequentially layering respective materials of Ni, Al, Ti and Au from the surface of the exposed area, on the exposed area, by a known method, it is possible to form the negative electrode bonding pad 9 of a 4-layer structure (details are not shown).

In this embodiment, when manufacturing the light-emitting device 1 according to the above-described order and conditions, as described above, it is preferable that the electrode separation direction size L be formed in an approximately rectangular shape to be longer than the chip width W from a planar view, as shown in the example of FIG. 2. Thus, it is possible to manufacture the light-emitting device 1 with high light emission efficiency.

According to the method of manufacturing the group III nitride semiconductor light-emitting device according to the present embodiment as described above, the method includes: the epitaxial step of forming the single-crystal underlayer (group III nitride semiconductor layer) 3 on the main surface 11a of the substrate 11; the semiconductor layer forming step of forming the semiconductor layer 20 by sequentially layering the n-type semiconductor layer 4, the light-emitting layer 5 and the p-type semiconductor layer 6 on the underlayer 3; and the light-transmitting electrode forming step of forming the light-transmitting electrode 7 on the p-type semiconductor layer 6. In the light-transmitting electrode forming step, the insulation layer 15 is formed on at least a part of the p-type semiconductor layer 6, and the light-transmitting electrode 7 is then formed to cover the insulation layer 15 on the p-type semiconductor layer 6. After the light-transmitting electrode forming step, the method further includes the positive electrode forming step of forming the positive electrode bonding pad 8 in the position "A" above the insulation layer 15 formed on the p-type semiconductor layer 6, on the surface 7a of the light-transmitting electrode 7. In the semiconductor layer forming step, the n-type semiconductor layer 4 is formed so that the sheet resistance Rs2 of the n-type semiconductor layer 4 is lower than the sheet resistance Rs1 of the light-transmitting electrode 7. Thus, it is possible to manufacture the light-emitting device 1 which has superior light emission efficiency and light extraction efficiency, has high external quantum efficiency, and superior electric characteristics.

[Lamp]

A lamp according to this embodiment uses the group III nitride semiconductor light-emitting device according to the present embodiments.

As an example of the lamp according to the present embodiment, a combination of the group III nitride semiconductor light-emitting device according to the present embodiments and a phosphor may be used. The lamp of the combination of the group III nitride semiconductor light-emitting device and the phosphor may be formed with a configuration known to those skilled in the art by a method known to those skilled in the art. Further, since techniques for changing light emission color by combining the group III nitride semiconductor light-emitting device and the phosphor are also known, any of the techniques may be adopted in the lamp according to the present embodiment without any limitation.

Figure 6:
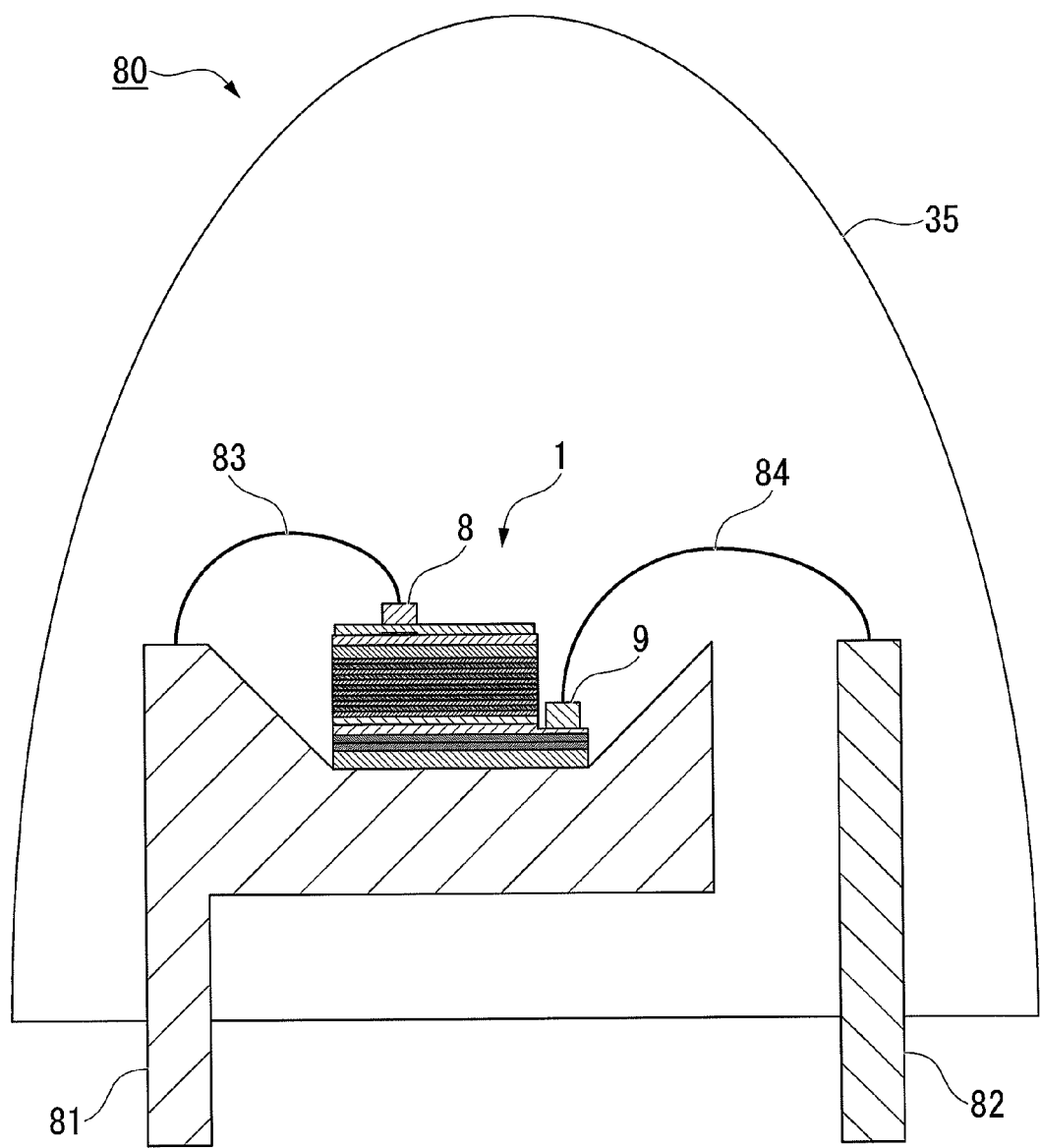
FIG. 6 is a diagram schematically illustrating an example of a lamp using a group III nitride semiconductor light-emitting device according to the present invention.

FIG. 6 is a diagram schematically illustrating an example of the lamp formed by using the group III nitride semiconductor light-emitting device according to the present embodiments. A lamp 80 shown in FIG. 5 is a bullet-shaped lamp, and uses the light-emitting device 1 shown in FIGS. 1 and 2. As shown in FIG. 6, the light-emitting device 1 is mounted by bonding the positive electrode bonding pad 8 of the light-emitting device 1 to one (frame 81 in FIG. 6) of two frames 81 and 82 using a wire 83, and by bonding the negative electrode bonding pad 9 of the light-emitting device 1 to the other frame 82 using a wire 84. In addition, the periphery around the light-emitting device 1 is encapsulated with a mold 85 formed of a transparent resin.

Since the lamp according to the present embodiment is prepared using the light-emitting device 1 according to the present embodiments, the lamp exhibits superior light emission properties.

The lamp according to the present embodiment may be also used for a variety of applications such as a bullet-shaped lamp for general application, a side view lamp for portable backlight application, and a top view lamp used in an indicator.

EXAMPLES

Next, the group III nitride semiconductor light-emitting device, its method of manufacturing and the lamp according to the present embodiments will be described in more detail below using examples and comparative examples, but the present embodiments are not limitative.

Example 1

In this example, samples of the light-emitting device were manufactured in the above-described processes (see FIGS. 1 to 4, FIG. 7 or the like).

Firstly, the substrate 11 having the main surface 11a formed from the (0001) C plane of a sapphire substrate was prepared. Here, in this example, a substrate in which a plurality of convex portions (not shown) was formed on the main surface 11a was used as the substrate 11 (see the convex portions 112 formed on the main surface 110 in FIGS. 3 and 4). Further, in this example, a substrate was used in which the base width $d_1$ of the convex portion formed on the main surface 11a was 1.3 μm, the height h was 0.7 μm, and the interval $d_2$ was 0.7 μm.

Further, the buffer layer 2 having a single-crystal structure, made of AlN and having a thickness of 50 nm was formed on the main surface 11a of the substrate 11 using the RF sputtering method. Here, as a sputtering deposition apparatus, an apparatus was used which was provided with an RF power supply and included a mechanism capable of moving the position of a magnet within a target.

The underlayer 3 formed of the group III nitride semiconductor layer was formed on the buffer layer 2 obtained as described above, using the following decompression MOCVD method (epitaxial step).

Firstly, the substrate 11, on which the buffer layer 2 was formed, which was taken out from the sputtering deposition apparatus, was introduced into a reaction furnace for the growth of the group III nitride semiconductor layer by the MOCVD method. Thereafter, while continuing circulation of ammonia gas and increasing the temperature of the substrate 11 to 1120° C. in a hydrogen atmosphere, trimethylgallium (TMG) started to be supplied to the vapor deposition reaction furnace, and undoped GaN was epitaxially grown on the buffer layer 2 up to the film thickness of 3 μm.

Subsequent to the formation of the underlayer 3, an initial layer of the n-type contact layer 4a formed of GaN was formed by the same MOCVD apparatus (semiconductor layer forming step). At this time, the n-type contact layer 4a was doped with Si. The crystal growth was performed under the same condition as in the underlayer, except that $SiH_4$ was circulated as a dopant material of Si.

Next, the n-type cladding layer 4b was layered on the n-type contact layer 4a manufactured in the above-described process, using the same MOCVD apparatus.

Further, when the n-type semiconductor layer 4 was formed, by appropriately adjusting the doping amount of Si, the sheet resistance was appropriately adjusted within a range shown in the following Table 1.

Next, the light-emitting layer 5 was layered on the n-type cladding layer 4b manufactured in the above-described process, using the same MOCVD apparatus.

The light-emitting layer 5 formed in this example has a multiple quantum well structure including the barrier layer 5a formed of GaN and the well layer 5b formed of $Ga_{0.85}In_{0.15}N$. In order to form the light-emitting layer 5 with such a structure, the barrier layer 5a was firstly formed on the n-type cladding layer 4b having a super-lattice structure of Si-doped GaInN and GaN, and the well layer 5b formed of $Ga_{0.85}In_{0.15}N$ was then formed on the barrier layer 5a. Such a layering procedure was repeated six times, and a seventh barrier layer 5a was then formed on the sixth layered well layer 5b, to thereby form a structure in which the barrier layer 5a was positioned on both sides of the light-emitting layer 5 having a multiple quantum well structure.

In this way, the light-emitting layer 5 having a multiple quantum well structure was formed.

Subsequent to the above-described respective processes, the same MOCVD apparatus was used to form the p-type cladding layer 6a having the super-lattice structure formed of four layers of undoped $Al_{0.06}Ga_{0.94}N$ and three layers of Mg-doped GaN. Then, the p-type contact layer 6b formed of a Mg-doped GaN with a film thickness of 200 nm was formed, to thereby complete the p-type semiconductor layer 6.

In this way, the respective layers of the n-type semiconductor layer 4, the light-emitting layer 5 and the p-type semiconductor layer p were sequentially layered on the underlayer 3 to thereby form the semiconductor layer 20.

Subsequently, the light-emitting diode (LED) which is a kind of the semiconductor light-emitting device was manufactured using the wafer obtained in the above-mentioned procedure, in the following procedure (see FIGS. 1 and 2).

Firstly, the insulation layer 15 formed of $SiO_2$ was formed using the known sputtering method, in one location on the p-type semiconductor layer 6. At this time, the insulation layer 15 was formed with a film thickness of 200 nm, and in a circular shape having a diameter of 100 μm.

Subsequently, a layer formed of IZO material was formed on the p-type semiconductor layer 6 to cover the insulation layer 15 using the known photolithography technique, to thereby form the light-transmitting electrode 7 (light-transmitting electrode forming step). At this time, the film thickness was set to 250 nm and the annealing process is performed under a nitrogen atmosphere, and thus, the sheet resistance of the light-transmitting electrode 7 was appropriately adjusted to a value shown in the following Table 1.

Then, Ti, Al and Au were sequentially layered in the position corresponding to the insulation layer 15 below the surface 7a of the light-transmitting electrode 7, on the surface 7a of the light-transmitting electrode 7, using the known photolithography technique, to thereby form the 3 layers positive bonding pad 8 (positive electrode forming step). At this time, the positive electrode bonding pad 8 was formed in a circular shape having a diameter of 90 μm.

Further, a part of the semiconductor layer 20 and the light-transmitting electrode 7 was removed through dry etching, to thereby form an exposed area in which the n-type contact layer 4a was exposed. Then, the respective layers of Ni, Al, Ti and Au were sequentially layered thereon, to thereby form the negative electrode bonding pad 9 as shown in FIGS. 1 and 2. Further, at this time, the distance between centers of the positive electrode bonding pad 8 and the negative electrode bonding pad 9 from a planar view of the wafer was 440 μm.

Next, the back surface of the substrate 11 of the wafer where each electrode was formed was ground and polished to form a mirror-like surface, and then the wafer was cut into a rectangular chip of 240 μm (chip width W)×600 μm (electrode separation direction size L), to thereby form the LED (light-emitting diode) chip (light-emitting device 1).

Further, this chip was mounted on the lead frame 81 so that the positive electrode bonding pad 8 and the negative electrode bonding pad 9 faced upwards, and was connected to a lead frame using gold wiring, to thereby manufacture the lamp 80 (see FIG. 6).

Then, the light emission output Po (mW) when a forward current of 20 mA flowed between the p-side electrode (positive electrode bonding pad 8) and the n-side electrode (negative electrode bonding pad 9) of the lamp prepared in this way was measured, and the drive electric current (Vf) at that time was measured, in which the results are shown in the following Table 1.

Examples 2 and 3, Comparative Examples 1 and 2

In Examples 2 and 3 and Comparative Examples 1 and 2, under the conditions of the presence or absence of the insulation layer, the film thickness of the light-transmitting electrode, and the distance between centers of the positive electrode bonding pad and the negative electrode bonding pad from a planar view of the wafer, shown in the following Table 1, the chip of the group III nitride semiconductor light-emitting device having a rectangular shape of 240 μm×600 μm was manufactured in a similar way to Example 1, except that the relationship of the respective sheet resistances were appropriately adjusted to be the relationship shown in the following Table 1. Further, similarly, the lamp was manufactured using this chip.

Further, the light emission output Po (mW) and the drive voltage (Vf) when a forward current of 20 mA flowed between the p-side electrode (positive electrode bonding pad) and the n-side electrode (negative electrode bonding pad) of the lamp prepared in this way were measured in the same way.

The measurement results of the sheet resistances and the film thicknesses of the light-transmitting electrode, the light emission output (Po) and the drive voltage (Vf) in the Examples 1 to 3 and Comparative Examples 1 and 2 are shown in the following Table 1.

TABLE 1

| | Sheet resistance (Ω/sq) | | Light-transmitting electrode Film thickness (nm) | Distance between positive and negative electrode bonding pads (μm) | Presence or absence of insulation layer | Light emission output (Po) (mW: IF = 20 mA) | Drive voltage (Vf) (mV) |
| --- | --- | --- | --- | --- | --- | --- | --- |
| No. | n-type semiconductor layer Rs2 | Light-transmitting electrode Rs1 | | | | | |
| Example 1 | 10 | 13 | 250 | 340 | Presence | 20.8 | 3.15 |
| Example 2 | 14 | 25 | 150 | 340 | Presence | 19.6 | 3.27 |

TABLE 1-continued

| | Sheet resistance (Ω/sq) | | Light-transmitting electrode Film thickness (nm) | Distance between positive and negative electrode bonding pads (μm) | Presence or absence of insulation layer | Light emission output (Po) (mW: IF = 20 mA) | Drive voltage (Vf) (mV) |
|---|---|---|---|---|---|---|---|
| No. | n-type semiconductor layer Rs2 | Light-transmitting electrode Rs1 | | | | | |
| Example 3 | 20 | 25 | 150 | 340 | Presence | 20 | 3.31 |
| Comparative Example 1 | 14 | 13 | 250 | 340 | Absence | 18.6 | 3.25 |
| Comparative Example 2 | 14 | 13 | 250 | 340 | Presence | 18.9 | 3.23 |

Examples 4 to 6

In Examples 4 to 6, under the conditions of the film thickness of the light-transmitting electrode and the relationship of the respective sheet resistances, shown in the following Table 2, the chip of the group III nitride semiconductor light-emitting device was manufactured in a similar way to Example 1, except that the relationship of the electrode separation direction size (L: chip length) and the chip width (W) in a direction perpendicular to the chip length, from a planar view of the wafer, were appropriately adjusted to be the relationship shown in the following Table 2. Further, similarly, the lamp was manufactured using this chip.

Further, the light emission output Po (mV) when a forward electric current IF of 30 mA, and as necessary, 100 mA flowed between the p-side electrode (positive electrode bonding pad) and the n-side electrode (negative electrode bonding pad) of the lamp was measured by the same method.

Specifications of the light-emitting device in Examples 4 to 6, and the measurement results of the light emission output (Po) are shown in Table 2.

Further, in Examples 1 to 3 in which in which the sheet resistance of the n-type semiconductor layer was lower than the sheet resistance of the light-transmitting electrode, it was found that light emission around the n-side negative electrode bonding pad was reduced and the area of a portion where light emission intensity was high was enlarged, compared with the light-emitting device according to Comparative Examples 1 and 2.

On the other hand, in the respective samples of Comparative Examples 1 and 2 in which the sheet resistance of the n-type semiconductor layer was higher than the sheet resistance of the light-transmitting electrode and the sheet resistances did not satisfy the relationship defined in the present embodiments, the light emission outputs were 18.6 to 18.9 mW, which were lower than those of the samples of the respective examples. In particular, in the sample of Comparative Example 1 in which the insulation layer was not formed, the light emission output was 18.6 mW, which was the lowest output.

In the samples of Comparative Examples 1 and 2, the sheet resistance of the n-type semiconductor layer was higher than

TABLE 2

| | Sheet resistance (Ω/sq) | | Light-transmitting electrode Film thickness (nm) | Respective Sizes from a planar view | | | | | Forward electric current (IF) = 30 mA | | Forward electric current (IF) = 100 mA |
|---|---|---|---|---|---|---|---|---|---|---|---|
| | | | | Electrode separation direction size (chip length L) (μm) | Chip width W (μm) | Aspect ratio (L/W) | Area (W × L: μm²) | Distance between electrode centers (μm) | Light emission output (Po) (mW) | Drive voltage (Vf) (mV) | Light emission output (Po) (mW) |
| No. | n-type semiconductor layer (Rs2) | Light-transmitting electrode (Rs1) | | | | | | | | | |
| Example 4 | 10 | 13 | 250 | 550 | 280 | 2.0 | 154000 | 340 | 31.5 | 3.05 | 80.2 |
| Example 5 | 10 | 13 | 250 | 550 | 260 | 2.1 | 143000 | 390 | 30.8 | 3.15 | 79.5 |
| Example 6 | 10 | 13 | 250 | 400 | 240 | 1.7 | 96000 | 220 | 28.1 | 3.20 | 75.0 |

[Evaluation Results]

As shown in Table 1, in the samples of Example 1 having the configuration of the light-emitting device according to the present embodiments, it was clear that the light emission output (Po) was 20.8 mW when the forward electric current (IF) was 20 mA, which exhibited high light emission output, and the drive voltage (Vf) at this time was 3.15 mV which was noticeably reduced, to thereby obtain superior electric characteristics. Further, in the respective samples of Examples 2 and 3 in which the sheet resistance Rs2 of the n-type semiconductor layer 4 was adjusted to be lower than the sheet resistance Rs1 of the light-transmitting electrode 7, it was found that the light emission outputs of 19.6 mW or higher were obtained, which were high light emission outputs.

the sheet resistance of the light-transmitting electrode, and the insulation layer was not formed in Comparative Example 1. Thus, in the samples of Comparative Examples 1 and 2, since the semiconductor layer in the position corresponding to the negative electrode bonding pad which was the n side emitted light, it was considered that the area of the portion with high light emission intensity became small, and light extraction efficiency was lowered.

Further, the results of examples 4 to 6 shown in Table 2 were examples in which the electrode separation direction size (L), the chip width (W) and the distance between centers of the positive electrode bonding pad and the negative electrode bonding pad, from a planar view of the wafer, were appropriately changed.

For example, in Example 4, when the chip size was L (=550 μm) and W (=280 μm), and the aspect ratio was 2.0, the light emission output when the forward electric current (IF) was 30 mA was 31.5 mW, which was a high output.

Further, in a state where the sheet resistance Rs2 of the n-type semiconductor layer, and the sheet resistance Rs1 of the light-transmitting electrode were the same as in Example 4, it could be understood that the light emission output was changed to 31.8 mW and 28.1 mW in Examples 5 and 6 in which the size from a planar view was changed.

In this way, from the results of Examples 4 to 6 shown in Table 2, in particular, when the chip size (W×L) was 280×550 μm (aspect ratio=2.0), in a case where the forward electric current (IF) was in a range of 30 mA to 100 mA, high light emission output and low drive voltage were achieved, compared with other chip shapes.

That is, in this embodiment, the above-described effect was obtained by adjusting the sheet resistance of the n-type semiconductor layer to be lower than the sheet resistance of the light-transmitting electrode, and more preferably, when the proportion of the chip length L to the chip width W was in the range of 1:1 (L/W=1) to 2.7:1 (L/W=2.7) to thereby form a square chip and a rectangular chip, under the condition that the forward electric current IF was 30 to 100 mA, the light emission efficiency was effectively enhanced.

It was clear from the results of the respective examples as described above that the group III nitride semiconductor light-emitting device according to the present embodiments had superior light emission efficiency by suppressing electric current concentration directly below the electrode, had superior light extraction efficiency by suppressing light absorption in the electrode or light loss due to multiple reflection therein, and has high light emission intensity and electric characteristics.

| DENOTATION OF REFERENCE NUMERALS | |
|---|---|
| 1: | Group III nitride semiconductor light-emitting device (light-emitting device) |
| 11, 100: | Substrate |
| 11a, 110: | Main surface |
| 4: | n-type semiconductor layer |
| 5: | Light-emitting layer |
| 6: | p-type semiconductor layer |
| 7: | Light-transmitting electrode |
| 7a: | Surface (light-transmitting electrode) |
| 8: | Positive electrode bonding pad |
| 15: | Insulation layer |
| 20: | Semiconductor layer |
| 80: | Lamp |
| A: | Position (position corresponding to the insulation layer on the surface of the light-transmitting electrode) |
| Rs1: | Sheet resistance (light-transmitting electrode) |
| Rs2: | Sheet resistance (n-type semiconductor layer) |

The invention claimed is:

1. A group III nitride semiconductor light-emitting device comprising:
   a substrate;
   a single-crystal group III nitride semiconductor layer which is formed on the substrate;
   a semiconductor layer which is formed on the single-crystal group III nitride semiconductor layer and in which an n-type semiconductor layer, a light-emitting layer and a p-type semiconductor layer are sequentially layered; and
   a light-transmitting electrode which is formed on the p-type semiconductor layer,
   wherein an insulation layer is formed on at least a part of the p-type semiconductor layer, and the light-transmitting electrode is formed to cover the insulation layer;
   on a surface of the light-transmitting electrode, a positive electrode bonding pad is provided above the insulation layer provided on the p-type semiconductor layer; and
   a sheet resistance of the n-type semiconductor layer is lower than a sheet resistance of the light-transmitting electrode.

2. The device according to claim 1,
   wherein the sheet resistance of the n-type semiconductor layer is 15 Ω/sq or less, and the sheet resistance of the light-transmitting electrode is 30 Ω/sq or less.

3. The device according to claim 1,
   wherein at least a part of the surface of the light-transmitting electrode is a rough surface.

4. The device according to claim 1,
   wherein the light-transmitting electrode employs at least one selected from the group consisting of ITO (Indium Tin Oxide), IZO (Indium Zinc Oxide), IGO (Indium Gallium Oxide), ICO (Indium Cerium Oxide) and conductive titanium oxide ($TiO_2$).

5. The device according to claim 1,
   wherein the insulation layer is formed of silicon dioxide ($SiO_2$).

6. A method of manufacturing a group III nitride semiconductor light-emitting device, the method comprising:
   an epitaxial step of forming a single-crystal group III nitride semiconductor layer on a substrate;
   a semiconductor layer forming step of forming a semiconductor layer by sequentially layering an n-type semiconductor layer, a light-emitting layer and a p-type semiconductor layer on the single-crystal group III nitride semiconductor layer; and
   a light-transmitting electrode forming step of forming a light-transmitting electrode on the p-type semiconductor layer,
   wherein an insulation layer is formed on at least a part of the p-type semiconductor layer, and the light-transmitting electrode is then formed to cover the insulation layer on the p-type semiconductor layer, in the light-transmitting electrode forming step;
   the method further comprises a positive electrode forming step of forming a positive electrode bonding pad above the insulation layer formed on the p-type semiconductor layer, on a surface of the light-transmitting electrode, after the light-transmitting electrode forming step; and
   the n-type semiconductor layer is formed, and sheet resistance of the n-type semiconductor layer is lower than sheet resistance of the light-transmitting electrode, in the semiconductor layer forming step.

7. The method according to claim 6,
   wherein the n-type semiconductor layer is formed to have a sheet resistance of 15 Ω/sq or less in the semiconductor layer forming step, and the light-transmitting electrode is formed to have a sheet resistance of 30 Ω/sq or less in the light-transmitting electrode forming step.

8. The method according to claim 6,
   wherein at least a part of the surface of the light-transmitting electrode is a rough surface, in the light-transmitting electrode forming step.

9. The method according to claim 6,
   wherein at least one selected from the group consisting of ITO (Indium Tin Oxide), IZO (Indium Zinc Oxide), IGO (Indium Gallium Oxide), ICO (Indium Cerium Oxide) and conductive titanium oxide ($TiO_2$) is used as the material which forms the light-transmitting electrode, in the light-transmitting electrode forming step.

10. The method according to claim 6,
wherein silicon dioxide ($SiO_2$) is used as a material which forms the insulation layer, in the light-transmitting electrode forming step.

11. A lamp comprising the group III nitride semiconductor light-emitting device according to claim 1.

* * * * *